United States Patent
Saie et al.

(10) Patent No.: US 8,753,801 B2
(45) Date of Patent: Jun. 17, 2014

(54) PHOTOSENSITIVE COMPOSITION, PATTERN FORMING MATERIAL, AND PHOTOSENSITIVE FILM, PATTERN FORMING METHOD, PATTERN FILM, LOW REFRACTIVE INDEX FILM, OPTICAL DEVICE AND SOLID-STATE IMAGING DEVICE EACH USING THE SAME

(75) Inventors: Toshiyuki Saie, Shizuoka (JP); Kenji Wada, Shizuoka (JP); Masaomi Makino, Shizuoka (JP); Hisamitsu Tomeba, Shizuoka (JP); Mitsuji Yoshibayashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 223 days.

(21) Appl. No.: 13/172,937

(22) Filed: Jun. 30, 2011

(65) Prior Publication Data

US 2012/0003436 A1    Jan. 5, 2012

(30) Foreign Application Priority Data

Jun. 30, 2010  (JP) ................................ 2010-150640
Sep. 30, 2010  (JP) ................................ 2010-223268
Dec. 28, 2010  (JP) ................................ 2010-294339

(51) Int. Cl.
   *G03F 7/00*   (2006.01)
(52) U.S. Cl.
   USPC ..................................... 430/321; 430/270.1
(58) Field of Classification Search
   USPC ................ 430/270.1, 320, 321, 323
   See application file for complete search history.

(56) References Cited

U.S. PATENT DOCUMENTS

| | | | |
|---|---|---|---|
| 7,759,049 B2 * | 7/2010 | Yamada et al. | ............... 430/306 |
| 2004/0012317 A1 | 1/2004 | Obayashi et al. | |
| 2005/0227165 A1 * | 10/2005 | Yamada et al. | ............ 430/270.1 |
| 2009/0053626 A1 * | 2/2009 | Takakuwa et al. | ................ 430/7 |
| 2009/0233227 A1 | 9/2009 | Hauck et al. | |

FOREIGN PATENT DOCUMENTS

| | | |
|---|---|---|
| EP | 1 731 325 A1 | 12/2006 |
| EP | 2 042 892 A2 | 4/2009 |
| EP | 2 168 766 A1 | 3/2010 |
| JP | 2003-055036 A | 2/2003 |
| JP | 3718031 B2 | 11/2005 |
| JP | 2010-031222 A | 2/2010 |
| JP | 2010-032996 A | 2/2010 |
| JP | 2011-075691 A | 4/2011 |
| JP | 2011-075786 A | 4/2011 |

OTHER PUBLICATIONS

Extended European Search Report Issued Nov. 3, 2011, in corresponding European Application No. 11172113.0.
Office Action dated Feb. 25, 2014 issued by the Japanese Patent Office in counterpart Japanese Patent Application No. 2010-294339.

* cited by examiner

*Primary Examiner* — Stewart Fraser
(74) *Attorney, Agent, or Firm* — Sughrue Mion, PLLC

(57) ABSTRACT

A photosensitive composition contains (A) a hollow or porous particle, (B) a compound capable of generating an active species upon irradiation with an actinic ray or radiation, and (C) a compound capable of changing in the solubility for an alkali developer by the action of the active species.

17 Claims, No Drawings

PHOTOSENSITIVE COMPOSITION, PATTERN FORMING MATERIAL, AND PHOTOSENSITIVE FILM, PATTERN FORMING METHOD, PATTERN FILM, LOW REFRACTIVE INDEX FILM, OPTICAL DEVICE AND SOLID-STATE IMAGING DEVICE EACH USING THE SAME

BACKGROUND OF THE INVENTION

1. Field of the Invention

The present invention relates to a photosensitive composition, a pattern forming material, and a photosensitive film, a pattern forming method, a pattern film, a low refractive index film, an optical device and a solid-state image device each using the same.

2. Description of the Related Art

A low refractive index film is formed, in an optical member, as an optical functional film contained in an antireflection film, a reflection film, a transflective film, a visible light-reflecting infrared-transmitting film, an infrared-reflecting visible light-transmitting film, a blue reflecting film, a green or red reflecting film, a bright line cut filter or a color correction film.

Not only in optical members having a flat surface profile but also in all of optical functional members such as luminance-enhancing lens film or diffusion film for liquid crystal backlight, Fresnel lens or lenticular lens used for video projection television screens, and microlens, the desired geometric-optical performance is obtained by designing the resin material to have a microscopic structure, and an optical functional film containing a low refractive index film is also required on the surface of such a microscopic structure.

In the case of using the low refractive index film as an antireflection film, a low refractive index film with a single-layer structure directly works as an antireflection film. As for the refractive index of an antireflection film having a single-layer structure, in the case where the base material is a transparent material such as resin material, a low refractive index of 1.2 to 1.35 is desired.

As the representative material for the low refractive index film, there are known a fluorine-based polymer material having a refractive index of 1.35 to 1.4, and a layer containing a porous material in which fine particles composed of a polymer of a fluorine monomer having a low refractive index of 1.37 to 1.46 are fused (see, for example, JP Patent No. 3718031), but a material having a refractive index of 1.3 or less is not obtained.

In addition to the above-described reflectance characteristics, it is demanded to solve various problems such as cumbersome production process. In JP-A-2010-31222 (the term "JP-A" as used herein means an "unexamined published Japanese patent application") and JP-A-2010-32996, a method of forming a pattern by using a silica-based material imparted with photosensitivity and exposing/developing the material itself is described as a patterning method using no photoresist so as to overcome the cumbersomeness of the production process, but the resolution in pattern formation is insufficient and at the same time, the low refractive index property of the obtained pattern is unsatisfied.

SUMMARY OF THE INVENTION

Under these circumstances, the present invention has been made, and the task of the present invention is to solve those various conventional problems and attain the following object.

That is, an object of the present invention is to provide a photosensitive composition and a pattern forming material, enjoying low refractive index and little development scum and being capable of forming a high-resolution pattern excellent in the dry etching resistance, and a photosensitive film, a pattern forming method, a pattern film, a low refractive index film, an optical device and a solid-state imaging device each using the same.

The present invention includes the following configurations, and the above-described object of the present invention can be attained by these configurations.

[1] A photosensitive composition comprising:
  (A) a hollow or porous particle,
  (B) a compound capable of generating an active species upon irradiation with an actinic ray or radiation, and
  (C) a compound capable of changing in the solubility for an alkali developer by the action of the active species.

[2] The photosensitive composition as described in [1] above, wherein the refractive index of the hollow or porous particle is from 1.10 to 1.40.

[3] The photosensitive composition as described in [1] or [2] above, wherein the compound (C) is a compound capable of decreasing the solubility for an alkali developer by the action of the active species.

[4] The photosensitive composition as described in any one of [1] to [3], wherein the compound (C) is a binder resin having an alkali-soluble group.

[5] The photosensitive composition as described in [4] above, wherein the binder resin further has a polymerizable group.

[6] The photosensitive composition as described in any one of [1] to [5] above, which further contains (D) a polymerizable compound.

[7] The photosensitive composition as described in any one of [1] to [6] above, which further contains (A') a particle dispersant.

[8] The photosensitive composition as described in any one of [1] to [7] above, which is used for coating of a microlens.

[9] A pattern forming material which is the photosensitive composition described in any one of [1] to [8] above.

[10] A photosensitive film formed of the photosensitive composition described in any one of [1] to [8] above.

[11] A pattern forming method comprising a step of forming the photosensitive film described in [10], a step of exposing said photosensitive film, and a development step of developing the exposed photosensitive film with an alkali developer to obtain a pattern film.

[12] The pattern forming method as described in [11] above, which further comprises a step of etching the pattern film after the development step.

[13] A pattern film obtained by the pattern forming method described in [11] or [12] above.

[14] A low refractive index film which is the pattern film described in [13] above.

[15] An optical device having the low refractive index film described in [14] above.

[16] A solid-state imaging device comprising the optical device described in [15] above.

The present invention preferably further includes the following configurations.

[17] The photosensitive composition as described in any one of [1], [2], [7] and [8] above, wherein the compound (C) is a compound capable of increasing the solubility for an alkali developer by the action of the active species.

[18] The photosensitive composition as described in any one of [1] to [8] above, wherein the compound (B) is a photopolymerization initiator.

[19] The photosensitive composition as described in any one of [1], [2], [7], [8] and [17] above, wherein the compound (B) is a photoacid generator.

[20] The photosensitive composition as described in any one of [1] to [8] and [17] to [19] above, wherein the hollow or porous particle (A) is a hollow particle.

[21] The photosensitive composition as described in any one of [1] to [8] and [17] to [20] above, wherein the hollow or porous particle (A) is a silica particle.

According to the present invention, a photosensitive composition and a pattern forming material, enjoying low refractive index and little development scum and being capable of forming a high-resolution pattern excellent in the dry etching resistance, and a photosensitive film, a pattern forming method, a pattern film, a low refractive index film, an optical device and a solid-state imaging device each using the same, can be provided.

DETAILED DESCRIPTION OF THE INVENTION

The present invention is described in detail below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The photosensitive composition of the present invention contains (A) a hollow or porous particle, (B) a compound capable of generating an active species upon irradiation with an actinic ray or radiation, and (C) a compound capable of changing in the solubility for an alkali developer by the action of the active species.

The reason why the effects of the present invention are obtained by using the photosensitive composition of the present invention is not clearly known, but it is considered that use of the hollow or porous particle (A) enables sufficient reduction in the refractive index of the pattern obtained as well as excellent dry etching resistance of the pattern and at the same time, use of the compound (B) and the compound (C) in combination greatly contributes to obtaining a pattern with high resolution.

Furthermore, although the mode of operation thereof is unknown, use of the hollow or porous particle (A) and the compound (C) in combination is presumed to contribute to suppressing the development scum for some reasons.

The photosensitive composition of the present invention is typically a negative composition (a composition for forming a negative pattern) or a positive composition (a composition for forming a positive pattern) and is preferably a negative composition.

The present invention also relates to a pattern forming material which is the photosensitive composition above.

The components of the photosensitive composition of the present invention are described in detail below.

[1] (A) Hollow or Porous Particle

The hollow particle is a particle having a structure including a cavity in the inside thereof and indicates a particle having a cavity surrounded by an outer shell, and the porous particle indicates a particle having a large number of voids and being porous.

In view of obtaining higher dry etching resistance, the hollow or porous particle is preferably a porous particle.

The porosity of such a particle is preferably from 10 to 80 vol %, more preferably from 20 to 60 vol %, and most preferably from 30 to 60 vol %. The porosity of the hollow or porous particle is preferably set to the range above for the purpose of reducing the refractive index and maintaining the durability of the particle.

From the standpoint that the refractive index is easily reduced, the hollow or porous particle is more preferably a hollow particle. For example, when the hollow particle is composed of silica, the hollow silica particle contains air having a low refractive index (refractive index=1.0) and therefore, the refractive index of the hollow silica particle is extremely low compared with normal silica (refractive index=1.46).

The production method of the hollow particle is described, for example, in JP-A-2001-233611. Also, the production method of the porous particle is described, for example, in JP-A-2003-327424, JP-A-2003-335515, JP-A-2003-226516 and JP-A-2003-238140.

The hollow or porous particle preferably has an average particle diameter of 1 to 200 nm, more preferably from 10 to 100 nm.

The average particle diameter of the hollow or porous particle can be determined from a photograph obtained by observing dispersed particles through a transmission electron microscope. The projected area of a particle is determined, and the equivalent-circle diameter is obtained therefrom and defined as an average particle diameter (usually, 300 or more particles are measured to determine the average particle diameter).

As for the refractive index of the hollow or porous particle, the refractive index of the particle is preferably from 1.10 to 1.40, more preferably from 1.15 to 1.35, and most preferably from 1.15 to 1.30.

The refractive index as used herein indicates the refractive index of the particle as a whole and in the case where the particle is a hollow particle, does not indicate the refractive index of only the outer shell forming the hollow particle. In the case where the particle is a porous particle, the refractive index of the porous particle can be measured by means of Abbe refractometer (manufactured by ATAGO Co., Ltd.).

From the standpoint of reducing the refractive index, the hollow or porous particle is preferably a hollow or porous inorganic particle. The low refractive index inorganic particle includes magnesium fluoride and silica particle, and in view of low refractive index, dispersion stability and cost, a silica particle is more preferred.

The primary particle diameter of the inorganic particle is preferably from 1 to 100 nm, more preferably from 1 to 60 nm.

The inorganic particle may be either crystalline or amorphous and may be a monodisperse particle or may be even an aggregate particle as long as the predetermined particle diameter is satisfied. The particle is most preferably in a spherical shape but may be also in a beaded shape, a shape with a major axis/short axis ratio of 1 or more, or an indefinite shape.

The specific surface area of the inorganic particle is preferably from 10 to 2,000 $m^2/g$, more preferably from 20 to 1,800 $m^2/g$, and most preferably from 50 to 1,500 $m^2/g$.

For stabilizing the dispersion in a dispersion liquid or a coating solution or for increasing the compatibility or binding property with a binder component, the inorganic particle may be subjected to a physical surface treatment such as plasma discharge treatment and corona discharge treatment, or a chemical surface treatment with a surfactant, a coupling agent or the like. Use of a coupling agent is preferred. As the coupling agent, an alkoxy metal compound (e.g., titanium coupling agent, silane coupling agent) is preferably used. Above all, a silane coupling treatment is effective.

That is, in the case where the inorganic particle is a silica particle and the coupling agent is a silane compound, a reaction between a silane compound and a silanol group takes place and an organosilyl group (monoorganosilyl, diorganosilyl or triorganosilyl group) is thereby bound to the surface of a silica particle. The organic group present in the surface of the surface-treated silica particle includes, for example, a saturated or unsaturated hydrocarbon group having a carbon number of 1 to 18 and a halogenated hydrocarbon group having a carbon number of 1 to 18.

The coupling agent may be also used as a surface treating agent for previously applying a surface treatment to the inorganic particle before preparing a coating solution for low refractive index film, or may be further added as an additive at the preparation of the coating solution.

It is preferred for reducing the load of surface treatment to previously disperse the inorganic particle in a medium.

As the silica particle, commercially available products may be preferably used.

Examples of the silica particle which can be used include Sluria Series (for example, isopropanol (IPA) dispersion or 4-methyl-2-pentanone (MIBK) dispersion) and OSCAL Series produced by JGC C&C; Snowtex series (for example, IPA dispersion, ethylene glycol dispersion, methyl ethyl ketone (MEK) dispersion, dimethylacetoamide dispersion, MIBK dispersion, propylene glycol monomethyl acetate dispersion, propylene glycol monomethyl ether dispersion, methanol dispersion, ethyl acetate dispersion, butyl acetate dispersion, xylene-n-butanol dispersion or toluene dispersion) produced by Nissan Chemical Industries, Ltd.; SiliNax produced by Nittetsu Mining Co., Ltd.; PL Series (for example, IPA dispersion) produced by Fuso Chemical Co., Ltd.; Aerosil Series (for example, propylene glycol acetate dispersion, ethylene glycol dispersion or MIBK dispersion) produced by EVONIK; and AERODISP Series produced by EVONIK.

In the case of adding, to the photosensitive composition, the silica particle as a dispersion liquid containing a silica particle and a particle dispersant (the particle dispersant is described in detail later), the content of the silica particle in the silica dispersion liquid is preferably from 10 to 50 mass %, more preferably from 15 to 40 mass %, still more preferably from 15 to 30 mass %.

As for the hollow or porous particle, one kind of a particle may be used alone, or two or more kinds of particles may be used in combination. In the case of using two or more kinds of particles in combination, for example, a hollow particle and a porous particle may be used in combination.

The content of the hollow or porous particle is preferably from 5 to 95 mass %, more preferably from 10 to 90 mass %, still more preferably from 20 to 90 mass %, based on the entire solid content of the photosensitive composition.

In the case of forming a film by using the photosensitive composition, the coated weight of the hollow or porous particle is preferably from 1 to 100 mg/m$^2$, more preferably from 5 to 80 mg/m$^2$, still more preferably from 10 to 60 mg/m$^2$. When the coated weight is 1 mg/m$^2$ or more, an effect of reducing the refractive index or an effect of improving the scratch resistance can be unfailingly obtained, and when the coated weight is 100 mg/m$^2$ or less, the film can be prevented from formation of fine unevenness on the surface to deteriorate the integrated reflectance.

[2] (A') Particle Dispersant

The photosensitive composition of the present invention preferably further contains (A') a particle dispersant for the purpose of enhancing the dispersibility of the hollow or porous particle.

The particle dispersant includes a dispersing resin such as polyamidoamine and a salt thereof, polycarboxylic acid and a salt thereof, high molecular weight unsaturated acid ester, modified polyurethane, modified polyester, modified poly (meth)acrylate, (meth)acrylic copolymer and naphthalenesulfonic acid-formalin condensate, and a compound such as polyoxyethylene alkyl phosphoric acid ester, polyoxyethylene alkylamine and alkanolamine, with a resin being preferred (hereinafter, sometimes referred to as a "dispersing resin").

The dispersing resin may be further classified into a linear polymer, a terminal modified polymer, a graft-type polymer and a block-type polymer, on the basis of the structure.

The dispersing resin adsorbs to the surface of a particle and acts to prevent re-aggregation. Therefore, preferred structures include a terminal modified polymer, a graft-type polymer and a block-type polymer, each having an anchoring site to the pigment surface.

The mass average molecular weight (in terms of polystyrene as measured by the GPC method) of the dispersing resin is preferably from 1,000 to $2\times10^5$, more preferably from 2,000 to $1\times10^5$, still more preferably from 5,000 to $5\times10^4$.

The dispersing resin is also available as a commercial product, and specific examples thereof include "Disperbyk-101 (polyamidoamine phosphate), 107 (carboxylic acid ester), 110 (acid group-containing copolymer), 111, 130 (polyamide), 161, 162, 163, 164, 165, 166 and 170 (high molecular weight copolymer)", and "BYK-P104, P105 (high molecular weight unsaturated polycarboxylic acid)" produced by BYK Chemie; "EFKA 4047, 4050-4010-4165 (polyurethane type), EFKA 4330-4340 (block copolymer), 4400-4402 (modified polyacrylate), 5010 (polyesteramide), 5765 (high molecular weight polycarboxylate), 6220 (fatty acid polyester), 6745 (phthalocyanine derivative) and 6750 (azo pigment derivative)" produced by EFKA; "AJISPER PB821 and PB822", produced by Ajinomoto-Fine-Techno Co., Inc.; "Florene TG-710 (urethane oligomer)" and "Polyflow No. 50E and No. 300 (acrylic copolymer)" produced by Kyoeisha Chemical Co., Ltd.; "Disparlon KS-860, 873SN, 874, #2150 (aliphatic polyvalent carboxylic acid), #7004 (polyether ester), DA-703-50, DA-705 and DA-725" produced by Kusumoto Chemicals Ltd.; "Demol RN, N (naphthalenesulfonic acid-formalin polycondensate), MS, C and SN-B (aromatic sulfonic acid-formalin polycondensate)", "Homogenol L-18 (polymer polycarboxylic acid)", "Emulgen 920, 930, 935 and 985 (polyoxyethylene nonylphenyl ether)" and "Acetamine 86 (stearylamine acetate)" produced by Kao Corporation; "Solsperse 5000 (phthalocyanine derivative), 22000 (azo pigment derivative, 13240 (polyesteramine), 3000, 17000, 27000 (polymer having a functional moiety at the terminal), 24000, 28000, 32000 and 38500 (graft-type polymer)" produced by The Lubrizol Corp.; "Nikkol T106 (polyoxyethylene sorbitan monooleate) and MYS-IEX (polyoxyethylene monostearate)" produced by Nikko Chemicals Co., Ltd.; "EFKA-46, EFKA-47, EFKA-47EA, EFKA POLYMER 100, EFKA POLYMER 400, EFKA POLYMER 401 and EFKA POLYMER 450" produced by Morishita Industries Co., Ltd.; and "Disperse Aid 6, Disperse Aid 8, Disperse Aid 15 and Disperse Aid 9100" produced by San Nopco Limited.

The dispersing resin may contain at least one structural unit selected from structural units represented by any of formulae (21) to (23) described later in the paragraph of (C) Compound capable of changing in the solubility for an alkali developer by the action of an active species.

Also, the dispersing resin may be a resin obtained by using, as a copolymer, a compound represented by formula (E-1) described later in the paragraph of the compound (C).

Also, nonionic, anionic and cationic surfactants may be used as the particle dispersant. These surfactants are available as a commercial product, and examples thereof include phthalocyanine derivative (commercial product, EFKA-745 (produced by EFKA)) and Solsperse 5000 (produced by The Lubrizol Corp.); a cationic surfactant such as organosiloxane polymer KP341 (produced by Shin-Etsu Chemical Industry Co., Ltd.), (meth)acrylic acid (co)polymer Polyflow No. 75, No. 90 and No. 95 (all produced by Kyoeisha Chemical Industry Co., Ltd.) and WO01 (produced by Yusho Co., Ltd.); a nonionic surfactant such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester; an anionic surfactant such as WO04, WO05 and WO17 (all produced by Yusho Co., Ltd.); various Solsperse dispersants such as Solsperse 3000, 5000, 9000, 12000, 13240, 13940, 17000, 24000, 26000 and 28000 (produced by The Lubrizol Corp.); ADEKA PLURONIC L31, F38, L42, L44, L61, L64, F68, L72, P95, F77, P84, F87, P94, L101, P103, F108, L121, P-123 (all produced by ADEKA Corp.), and IONET S-20 (produced by Sanyo Chemical Industries, Ltd.). Other examples include an amphoteric dispersant such as Hinoact T-8000E produced by Kawaken Fine Chemicals Co., Ltd.

Other examples include ELEBASE BA-100, BA-200, BCP-2, BUB-3, BUB-4, CP-800K, EDP-475, HEB-5, Finesurf 270, 7045, 7085, Brownon DSP-12.5, DT-03, L-205, LPE-1007, O-205, S-202, S-204, S-207 and S-205T (Aoki Oil Industrial Co., Ltd.); EMULGEN A-500, PP-290, Amiet 102, 105, 302, 320, Aminon PK-02S, Emanon CH-25, EMULGEN 104P, 108, 404, 408, A-60, A-90, B-66, LS-106, LS-114, Reodol 430V, 440V, 460V, TW-S106, TW-S120V and Reodol Super TW-L120 (Kao Corp.); Newcargen 3000S, FS-3PG, FE-7PG and Pionin D-6414 (Takemoto Oil & Fat Co., Ltd.); DYNOL 604, Olfine PD-002W, Surfinol 2502, 440, 465, 485 and 61 (Nisshin Chemical Industry Co., Ltd.).

Other examples include Phosphanol ML-200, Emal 20T, E-27, NEOPELEX GS, NEOPELEX NBL, SS-H, SS-L, Poise 532A, RAMTEL ASK, E-118B and E-150 (Kao Corp.); EMULSOGEN COL-020, 070 and 080 (Clariant Japan Co., Ltd.); Plysurf A208B, A210B, A210G, A219B, AL and Lavelin FC-45 (Daiichi Kogyo Seiyaku Co., Ltd.); Pionin A-24-EA, A-28-B, A-29-M, A-44-B and A-44TW (Takemoto Oil & Fat Co., Ltd.); AKYPO RLM100NV, RLM45, RLM45NV, ECT-3, ECT-3NEX, ECT-7, Phosten HLP, HLP-1 and HLP-TEA (Nihon Surfactant Kogyo K.K.).

One of these particle dispersants may be used alone, or two or more thereof may be used in combination.

The content of the particle dispersant in the photosensitive composition is preferably from 1 to 100 mass %, more preferably from 5 to 80 mass %, still more preferably from 10 to 60 mass %, based on the hollow or porous particle.

Specifically, when the particle dispersant is a dispersing resin, the amount used thereof is preferably from 5 to 100 mass %, more preferably from 10 to 80 mass %, based on the hollow or porous particle.

[3] (B) Compound capable of generating an active species upon irradiation with an actinic ray or radiation The photosensitive composition of the present invention contains (B) a compound capable of generating an active species upon irradiation with an actinic ray or radiation.

The photosensitive composition of the present invention containing the compound (B) and thereby being imparted with photosensitivity can be suitably used for a photoresist, a color resist, an optical coating material and the like.

The compound (B) is suitably a photopolymerization initiator for the negative photosensitive composition and a photoacid generator for the positive photosensitive composition. That is, the active species is suitably a radical, a cation species or an anion species (preferably a radical or a cation species) for the negative photosensitive composition and an acid for the positive photosensitive composition.

[3-1] Photopolymerization Initiator

The photopolymerization initiator is not particularly limited and may be appropriately selected from known photopolymerization initiators. For example, those having photosensitivity to light in the region from ultraviolet to visible are preferred, and the initiator may be an activator capable of causing a certain action with the photoexcited sensitizer to produce an active radial or an initiator capable of initiating cationic polymerization according to the kind of the monomer.

The photopolymerization initiator preferably contains at least one kind of a component having a molecular extinction coefficient of at least about 50 in the range of approximately from 200 to 800 nm (more preferably from 300 to 450 nm).

The photopolymerization initiator includes a radical photopolymerization initiator and a cationic photopolymerization initiator and is preferably a radical photopolymerization initiator.

(Radical Photopolymerization Initiator)

Examples of the radial photopolymerization initiator include halogenated hydrocarbon derivatives (for example, a halogenated hydrocarbon compound having a triazine skeleton and a halogenated hydrocarbon compound having an oxadiazole skeleton), hexaarylbiimidazole compounds, lophine dimers, benzoins, ketals, 2,3-dialkyldione compounds, organic peroxides, thio compounds, disulfide compounds, azo compounds, borate salts, inorganic complexes, coumarins, ketone compounds (benzophenones, thioxanthones, thiochromanones, anthraquinones), aromatic onium salts, fluoroamine compounds, ketoxime ethers, acetophenones (aminoacetophenone compound, hydroxyacetophenone compound), acylphosphine compounds such as acylphosphine oxide, and oxime compounds such as oxime derivative. In view of sensitivity and resolution, the radical photopolymerization initiator is preferably an oxime compound.

Examples of the halogenated hydrocarbon compound having a triazine skeleton include compounds described in Wakabayashi et al., $Bull.\ Chem.\ Soc.\ Japan,$ 42, 2924 (1969), compounds described in Britain Patent 1388492, compounds described in JP-A-53-133428, compounds described in Germany Patent 3337024, compounds described in F. C. Schaefer et al., $J.\ Org.\ Chem.,$ 29, 1527 (1964), compounds described in JP-A-62-58241, compounds described in JP-A-5-281728, compounds described in JP-A-5-34920, and compounds described in U.S. Pat. No. 4,212,976.

The compounds described in U.S. Pat. No. 4,212,976 include, for example, a compound having an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tribromomethyl-5-styryl-1,3,4-oxadiazole).

Examples of the benzoins include benzoin, benzoin methyl ether, benzoin ethyl ether, benzoin isopropyl ether, benzyl dimethyl ketal, benzoin benzenesulfonic acid ester, benzoin toluenesulfonic acid ester, benzoin methyl ether, benzoin ethyl ether and benzoin isopropyl ether.

Examples of the borate salts include organoborate salt compounds described in Japanese Patent 2764769, JP-A-2002-116539 and Kunz, Martin, et al., *Rad Tech '98, Proceeding April*, pp. 19-22 (1998, Chicago), and compounds described in paragraphs [0022] to [0027] of JP-A-2002-116539, supra. Specific examples of other organoboron compounds include organoboron transition metal coordination complexes described in JP-A-6-348011, JP-A-7-128785, JP-A-7-140589, JP-A-7-306527 and JP-A-7-292014. Specific examples thereof include ion complexes with a cationic dye.

Examples of the radical polymerization initiator other than those described above include acridine derivatives (e.g., 9-phenylacridine, 1,7-bis(9,9'-acridinyl)heptane), N-phenylglycine, polyhalogen compounds (e.g., carbon tetrabromide, phenyl tribromomethyl sulfone, phenyl trichloromethyl ketone), coumarins (e.g., 3-(2-benzofuroyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazole-2-ylcoumarin, coumarin compounds described in JP-A-5-19475, JP-A-7-271028, JPA-2002-363206, JP-A-2002-363207, JP-A-2002-363208 and JP-A-2002-363209), acylphosphine oxides (e.g., bis(2,4,6-trimethylbenzoyl)-phenylphosphine oxide, bis(2,6-dimethoxybenzoyl)-2,4,4-trimethyl-pentylphenylphosphine oxide, Lucirin TPO), metallocenes (e.g., bis(η5-2,4-chyclopentadien-1-yl)-bis(2,6-difluoro-3-(1H-pyrrol-1-yl)-phenyl) titanium, η5-cyclopentadienyl-η6-cumenyl-iron(1+)-hexafluorophosphate (1−)), and compounds described in JP-A-53-133428, JP-B-57-1819 (the term "JP-B" as used herein means an "examined Japanese patent publication"), JP-B-57-6096, and U.S. Pat. No. 3,615,455.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acids and tetramethyl esters thereof, 4,4'-bis(dialkylamino)benzophenones (e.g., 4,4'-bis(dimethylamino)benzophenone, 4,4'-bis(dicyclohexylamino)benzophenone, 4,4'-bis(diethylamino) benzophenone, 4,4'-bis(dihydroxyethylamino) benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (e.g., benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, and N-butyl-chloroacridone.

The radical polymerization initiator is more preferably a compound selected from the group consisting of an aminoacetophenone compound, a hydroxyacetophenone compound, an acylphosphine compound and an oxime compound. More specifically, for example, an aminoacetophenone-based initiator described in JP-A-10-291969, an acylphosphine oxide-based initiator described in Japanese Patent 4225898, and an oxime-based initiator may be used, and furthermore, compounds described in JP-A-2001-233842 may be also used as an oxime-based initiator.

As the aminoacetophenone-based initiator, commercial products IRGACURE-907, IRGACURE-369 and IRGACURE-379 (trade names, all produced by BASF Japan) may be used. As the acylphosphine-based initiator, commercial products IRGACURE-819 and DAROCUR-TPO (trade names, both produced by BASF Japan) may be used.

The hydroxyacetophenone compound is preferably a compound represented by the following formula (V):

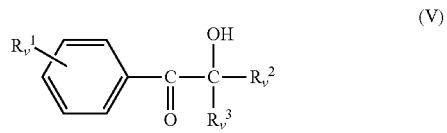

In formula (V), $R_v^1$ represents a hydrogen atom, an alkyl group (preferably an alkyl group having a carbon number of 1 to 10), an alkoxy group (preferably an alkoxy group having a carbon number of 1 to 10), or a divalent organic group. In the case where $R_v^1$ is a divalent organic group, the compound is a dimer where two photoactive hydroxyacetophenone structures (that is, a structure formed by removing the substituent $R_v^1$ from the compound represented by formula (V)) are connected through $R_v^1$. Each of $R_v^2$ and $R_v^3$ independently represents a hydrogen atom or an alkyl group (preferably an alkyl group having a carbon number of 1 to 10). $R_v^2$ and $R_v^3$ may combine to form a ring (preferably a ring having a carbon number of 4 to 8).

The alkyl group and alkoxy group as the alkyl group as $R_v^2$ and $R_v^3$, and the ring formed by combining $R_v^2$ and $R_v^3$ may further have a substituent.

Examples of the hydroxyacetophenone compound include 2-hydroxy-2-methyl-1-phenylpropan-1-one (DAROCURE 1173), 2-hydroxy-2-methyl-1-phenylbutan-1-one, 1-(4-methylphenyl)-2-hydroxy-2-methylpropan-1-one, 1-(4-isopropylphenyl)-2-methylpropan-1-one, 1-(4-butylphenyl)-2-hydroxy-2-methylpropan-1-one, 2-hydroxy-2-methyl-1-(4-octylphenyl)propan-1-one, 1-(4-dodecylphenyl)-2-methylpropan-1-one, 1-(4-methoxyphenyl)-2-methylpropan-1-one, 1-(4-methylthiophenyl)-2-methylpropan-1-one, 1-(4-chlorophenyl)-2-hydroxy-2- methylpropan-1-one, 1-(4-bromophenyl)-2-hydroxy-2-methylpropan-1-one, 2-hydroxy-1-(4-hydroxyphenyl)-2-methylpropan-1-one, 1-(4-dimethylaminophenyl)-2-hydroxy-2-methylpropan-1-one, 1-(4-carboethoxyphenyl)-2-hydroxy-2-methylpropan-1-one, 1-hydroxycyclohexylphenyl ketone (IRGACURE 184) and 1-[4-(2-hydroxyethoxy)-phenyl)]-2-hydroxy-2-methyl-1-propan-1-one (IRGACURE 2959).

Also, as the commercially available α-hydroxyacetophenone compound, polymerization initiators available from BASF Japan under trade names of IRGACURE 184, DAROCURE 1173, IRGACURE 127, IRGACURE 2959, IRGACURE 1800, IRGACURE 1870 and DAROCURE 4265 may be used.

As the acylphosphine-based initiator, commercial products IRGACURE-819, IRGACURE-819DW and DAROCUR-TPO (trade names. all produced by BASF Japan) may be used. Furthermore, a phosphine-based initiator described in JP-A-2009-134098 is also applicable.

Examples of the oxime compound such as oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include compounds described in *J. C. S. Perkin II*, pp. 1653-1660 (1979), *J. C. S. Perkin II*, pp. 156-162 (1979), *Journal of Photopolymer Science and Technology*, pp. 202-232 (1995), JP-A-2000-66385, JP-A-2000-80068, JP-T-2004-534797 (the term "JP-T" as used herein means a published Japanese translation of a PCT patent application), and JP-A-2006-342166.

As the commercial product, IRGACURE-OXE01 (produced by BASF Japan) and IRGACURE-OXE02 (produced by BASF Japan) may be also suitably used.

Furthermore, cyclic oxime compounds described in JP-A-2007-231000 and JP-A-2007-322744 may be also suitably used.

Most preferred oxime compounds include an oxime compound having a specific substituent described in JP-A-2007-269779 and an oxime compound having a thioaryl group described in JP-A-2009-191061.

Specifically, the oxime compound is preferably a compound represented by the following formula (I). Incidentally, the oxime compound may be an oxime compound where the N—O bond of the oxime bond is an (E) form, an oxime compound where the bond is a (Z) form, or a mixture of a (E) form and a (Z) form.

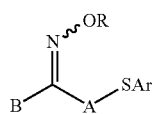

(I)

(In formula (I), each of R and B independently represents a monovalent substituent, A represents a divalent organic group, and Ar represents an aryl group.)

The monovalent substituent represented by R is preferably a monovalent nonmetallic atomic group.

Examples of the monovalent nonmetallic atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. The substituent may be further substituted with another substituent.

Examples of the substituent include a halogen atom, an aryloxy group, an alkoxycarbonyl group, an aryloxycarbonyl group, an acyloxy group, an acyl group, an alkyl group and an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B is an aryl group, a heterocyclic group, an arylcarbonyl group, or a heterocyclic carbonyl group. These groups may have one or more substituents. Examples of the substituent include the substituents described above. Also, the above-described substituent may be further substituted with another substituent.

Above all, the structures shown below are preferred.

In the structures, Y, X and n have the same meanings as Y, X and n in Formula (II) described later, and preferred examples are also the same.

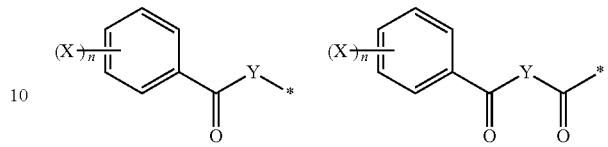

The divalent organic group represented by A include an alkylene group having a carbon number of 1 to 12, a cyclohexylene group having a carbon number of 6 to 12, and an alkynylene group having a carbon number of 2 to 12. These groups may have one or more substituents. Examples of the substituent include the substituents described above. Also, the above-described substituent may be further substituted with another substituent.

Above all, from the standpoint of increasing the sensitivity and suppressing the coloration by heating or with aging, A is preferably an unsubstituted alkylene group, an alkyl group (e.g. methyl group, ethyl group, tert-butyl group, dodecyl group)-substituted alkylene group, an alkenyl group (e.g. vinyl group, allyl group)-substituted alkylene group, or an aryl group (e.g. phenyl group, p-tolyl group, xylyl group, cumenyl group, naphthyl group, anthryl group, phenanthryl group, styryl group)-substituted alkylene group.

The aryl group represented by Ar is preferably an aryl group having a carbon number of 6 to 30 and may have a substituent. Examples of the substituent are the same as those of the substituent introduced into a substituted aryl group described as a specific example of the aryl group which may have a substituent.

Among these, from the viewpoint of increasing the sensitivity and suppressing the coloration by heating or aging, a substituted or unsubstituted phenyl group is preferred.

In formula (I), in view of sensitivity, the structure of "SAr" formed by Ar and S adjacent thereto is preferably a structure shown below. Me represents a methyl group, and Et represents an ethyl group.

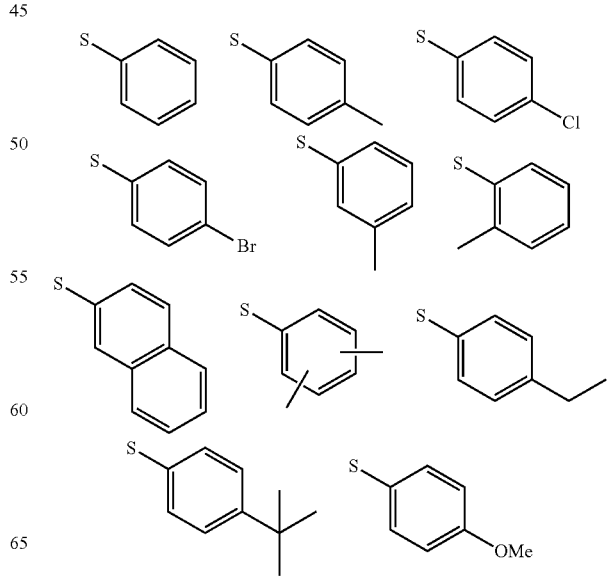

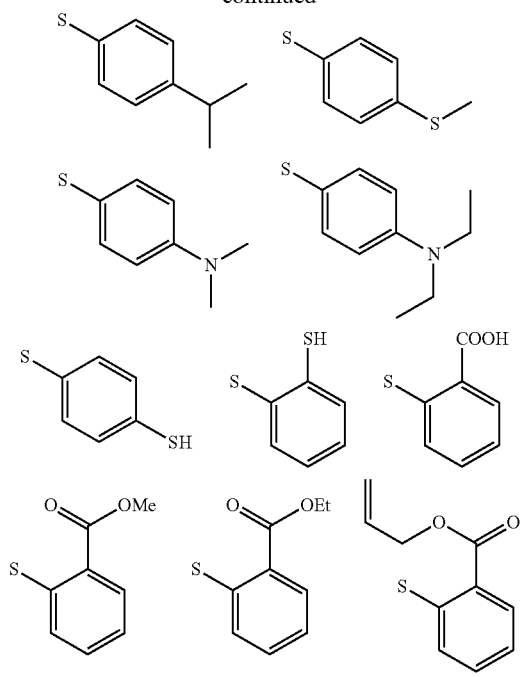

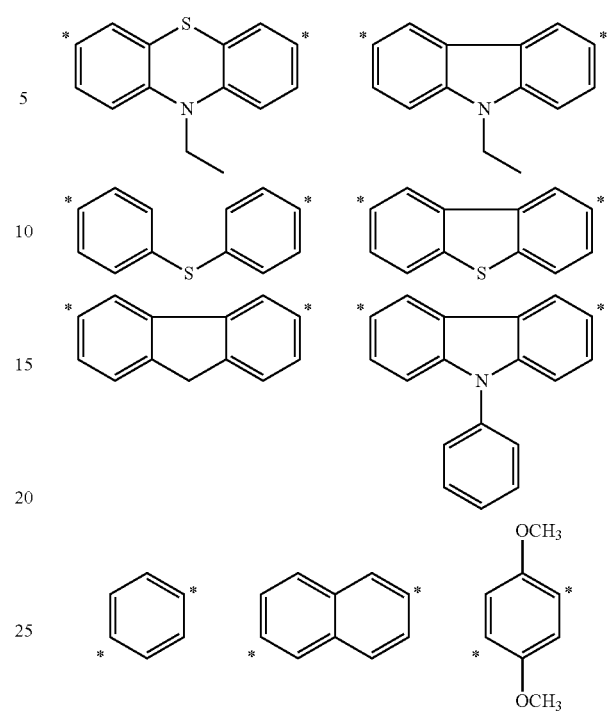

The oxime compound is preferably a compound represented by the following formula (II):

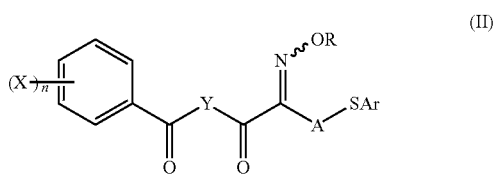

(In formula (II), each of R and X independently represents a monovalent substituent, each of A and Y independently represents a divalent organic group, Ar represents an aryl group, and n is an integer of 0 to 5.)

In formula (II), R, A and Ar have the same meanings as R, A and Ar in formula (I), and preferred examples are also the same.

The monovalent substituent represented by X includes an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituent include the substituents described above. The above-described substituents may be further substituted with another substituent.

Among these, X is preferably an alkyl group from the standpoint of enhancing solvent solubility and absorption efficiency in the long wavelength region.

In formula (II), n represents an integer of 0 to 5 and is preferably an integer of 0 to 2.

The divalent organic group represented by Y includes the structures shown below. In the groups shown below, "*" indicates the bonding position to the carbon atom adjacent to Y in formula (II).

Among these, the structures shown below are preferred from the standpoint of increasing the sensitivity.

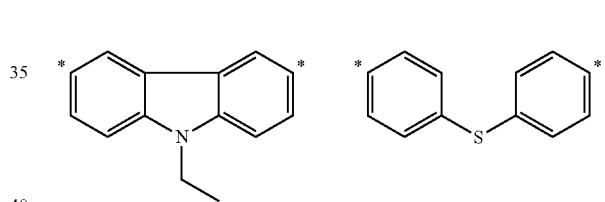

Furthermore, the oxime compound is preferably a compound represented by the following formula (III):

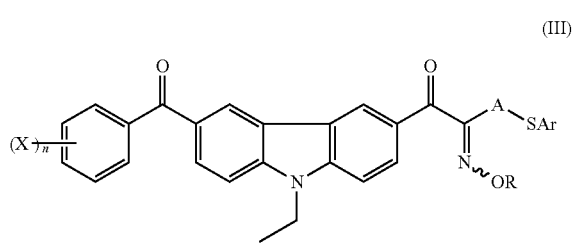

(In formula (III), each of R and X independently represents a monovalent substituent, A represents a divalent organic group, Ar represents an aryl group, and n is an integer of 0 to 5.)

In formula (III), R, X, A, Ar and n have the same meanings as R, X, A, Ar and n in formula (II), and preferred examples are also the same.

Specific examples (B-1) to (B-10) of the oxime compound which is suitably used are illustrated below, but the present invention is not limited thereto.

(B-1)
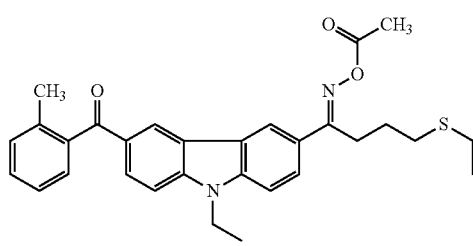

(B-2)
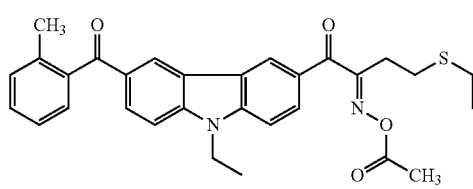

(B-3)
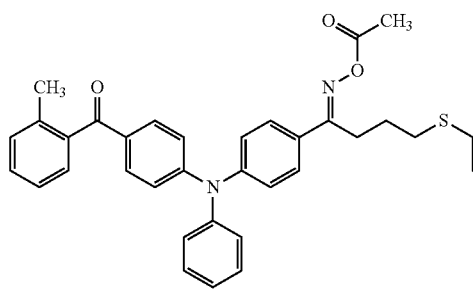

(B-4)
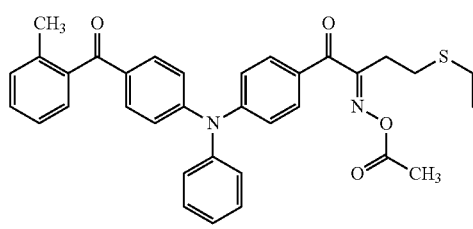

(B-5)
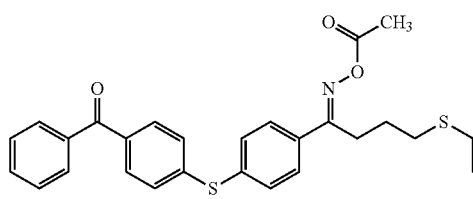

(B-6)
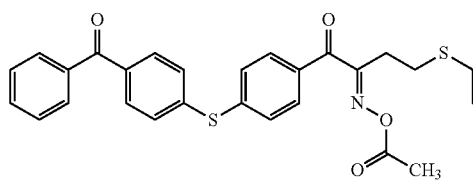

-continued (B-7)
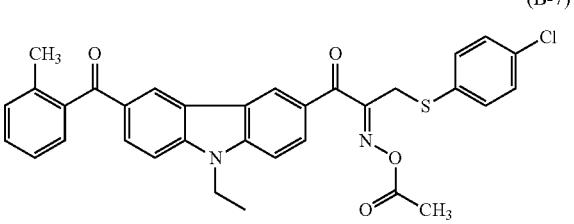

(B-8)
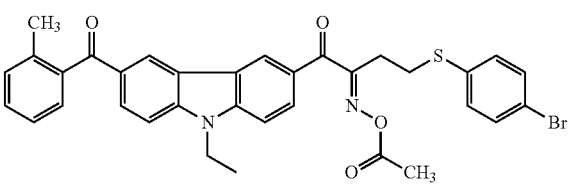

(B-9)
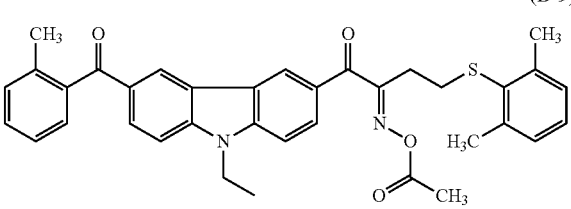

(B-10)
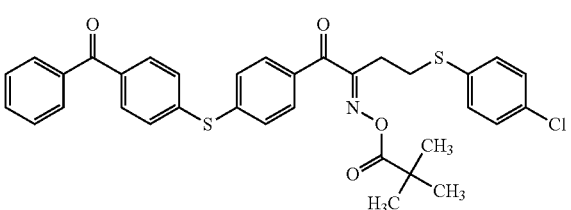

The oxime compound is a compound having a maximum absorption wavelength in the wavelength region of 350 to 500 nm, preferably a compound having an absorption wavelength in the wavelength region of 360 to 480 nm, more preferably a compound having high absorbance at 365 nm and 405 nm.

In view of sensitivity, the molar extinction coefficient at 365 nm or 405 nm of the oxime compound is preferably from 3,000 to 300,000, more preferably 5,000 to 300,000, still more preferably from 10,000 to 200,000.

The molar extinction coefficient of the compound may be measured by a known method but is preferably measured, for example, by using, specifically, an ultraviolet-visible spectrophotometer (Carry-5 spectrophotometer manufactured by Varian) with an ethyl acetate solvent at a concentration of 0.01 g/L.

(Cationic Photopolymerization Initiator)

The cationic photopolymerization initiator may be sufficient if it is, for example, a compound capable of producing a cationic photopolymerization initiating substance by receiving an energy ray such as ultraviolet ray, and the initiator is preferably an onium salt, more preferably an aromatic onium salt, still more preferably an arylsulfonium salt or an aryliodonium salt.

Specific examples of the onium salt include diphenyliodonium, 4-methoxydiphenyliodonium, bis(4-methylphenyl)iodonium, bis(4-tert-butylphenyl)iodonium, bis(dodecylphenyl)iodonium, triphenylsulfonium, diphenyl-4-thiophenoxyphenylsulfonium, bis[4-(diphenylsulfonio)-phenyl]sulfide, bis[4-(di(4-(2-hydroxyethyl)phenyl)

sulfonio)-phenyl]sulfide, and η5-2,4-(cyclopentadienyl)[1,2,3,4,5,6-η]-(methylethyl)-benzene]-iron(1+). Specific examples of the anion include tetrafluoroborate ($BF_4^-$), hexafluorophosphate ($PF_6^-$), hexafluoroantimonate ($SbF_6^-$), hexafluoroarcenate ($AsF_6^-$), hexachloroantimonate ($SbCl_6^-$), perchlorate ion ($ClO_4^-$), trifluoromethanesulfonate ion ($CF_3SO_3^-$), fluorosulfonate ion ($FSO_3^-$), toluenesulfonate ion, trinitrobenzenesulfonate anion, and trinitrotoluenesulfonate anion.

In particular, specific examples of the aromatic onium salt include aromatic halonium salts described by JP-A-50-151996 and JP-A-50-158680, Group VIA aromatic onium salts described in JP-A-50-151997, JP-A-52-30899, JP-A-56-55420 and JP-A-55-125105, Group VA aromatic onium salts described in JP-A-50-158698, oxosulfoxonium salts described in JP-A-56-8428, JP-A-56-149402 and JP-A-57-192429, aromatic diazonium salts described in JP-A-49-17040, thiopyrylium salts described in U.S. Pat. No. 4,139,655, an iron/allene complex, an aluminum complex/photodegradable silicon compound initiator, a halide capable of photolytically generating a hydrogen halide, an o-nitrobenzyl ester compound, an imidosulfonate compound, a bissulfonyldiazomethane compound, and an oxime sulfonate compound.

As the cationic photopolymerization initiator which can be used in the present invention, for example, compounds utilized for chemical amplification photoresist or cationic photopolymerization may be widely employed (see *Imaging yo Yuki Zairyo* (*Organic Materials for Imaging*), compiled by JOEM, Bunshin Shuppan, pp. 187-192 (1993)). These compounds can be easily synthesized by a known method, similarly to cationic photopolymerization initiators described in *THE CHEMICAL SOCIETY OF JAPAN*, Vol. 71, No. 11 (1998), and *Imaging yo Yuki Zairyo* (*Organic Materials for Imaging*), compiled by JOEM, Bunshin Shuppan (1993).

Examples of the commercially available cationic photopolymerization initiator include UVI-6950, UVI-6970, UVI-6974, UVI-6990, UVI-6992 (all produced by Union Carbide Corp.), ADEKA OPTOMER SP-150, SP-151, SP-170, SP-171, SP-172 (all produced by ADEKA), Irgacure 261, IRGACURE OXE01, IRGACURE CGI-1397, CGI-1325, CGI-1380, CGI-1311, CGI-263, CGI-268, CGI-1397, CGI-1325, CGI-1380, CGI-1311 (all produced by BASF Japan), CI-2481, CI-2624, CI-2639, CI-2064 (all produced by Nippon Soda Co., Ltd.), CD-1010, CD-1011, CD-1012 (all produced by Sartomer Company, Inc.), DTS-102, DTS-103, NAT-103, NDS-103, TPS-103, MDS-103, MPI-103, BBI-103 (all produced by Midori Kagaku Co., Ltd.), PCI-061T, PCI-062T, PCI-020T, PCI-022T (all produced by Nippon Kayaku Co., Ltd.), PHOTOINITIATOR 2074 (produced by Rhodia), UR-1104, UR-1105, UR-1106, UR-1107, UR-1113, UR-1114, UR-1115, UR-1118, UR-1200, UR-1201, UR-1202, UR-1203, UR-1204, UR-1205, UR-1207, UR-1401, UR-1402, UR-1403, UR-M1010, UR-M1011, UR-M10112, UR-SAIT01, UR-SAIT02, UR-SAIT03, UR-SAIT04, UR-SAIT05, UR-SAIT06, UR-SAIT07, UR-SAIT08, UR-SAIT09, UR-SAIT10, UR-SAIT11, UR-SAIT12, UR-SAIT13, UR-SAIT14, UR-SAIT15, UR-SAIT16, UR-SAIT22, and UR-SAIT30 (all produced by URAY). Among these, UVI-6970, UVI-6974, ADEKA OPTOMER SP-170, SP-171, SP-172, CD-1012 and MPI-103 can allow a composition containing such an initiator to bring out high photocuring sensitivity. One of these cationic photopolymerization initiators may be used alone, or two or more thereof may be used in combination.

As for the radical photopolymerization initiator and the cationic photopolymerization initiator, one initiator may be used alone, or two or more initiators may be freely combined.

[3-2] Photoacid Generator

As the photoacid generator, the above-described cationic photopolymerization initiator may be used, and a compound where the counter anion of the onium salt is a sulfonate is preferred.

The content of the compound (B) is preferably from 0.1 to 50 mass %, more preferably from 0.5 to 20 mass %, still more preferably from 1 to 5 mass %, based on the entire solid content of the photosensitive composition of the present invention.

[4] (C) Compound capable of changing in the solubility for an alkali developer by the action of an active species The photosensitive composition of the present invention contains (C) a compound capable of changing in the solubility for an alkali developer by the action of an active species.

The compound (C) includes a compound capable of decreasing the solubility for an alkali developer by the action of an active species in the case of a negative photosensitive composition and a compound capable of increasing the solubility for an alkali developer by the action of an active species in the case of a positive photosensitive composition.

The compound capable of decreasing the solubility for an alkali developer by the action of an active species and the compound capable of increasing the solubility for an alkali developer by the action of an active species are described in detail below.

[4-1] Compound capable of decreasing the solubility for an alkali developer by the action of an active species The compound capable of decreasing the solubility for an alkali developer by the action of an active species is preferably a binder resin (hereinafter, sometimes referred to as a "developable binder resin"), because the binder resin not only exhibits developability for an alkali developer in the unexposed area but also diffuses a hollow or porous particle in the film.

The developable binder resin is not particularly limited as long as it is an alkali-soluble and it is a resin capable of decreasing the solubility for an alkali developer by the action of an active species, but this is preferably selected in view of heat resistance, developability, curability, availability and the like. The term "alkali-soluble" as used herein includes both exhibiting solubility for an alkali developer and exhibiting swellability for an alkali developer.

That is, in the photosensitive composition of the present invention, the developable binder resin is used so as not only to enhance the film formability but also to obtain developability for an alkali developer.

The developable binder resin is preferably a binder resin having an alkali-soluble group.

Examples of the alkali-soluble group include an acid group, an alcoholic hydroxyl group, a pyrrolidone group, and an alkylene oxide group, with an acid group being preferred.

The acid group is not particularly limited, but examples thereof include a carboxyl group, an active methylene group, a phosphoric acid group, a sulfonic acid group, a phenolic hydroxyl group and a carboxylic anhydride group. Among these, a carboxyl group and an active methylene group are preferred, and a carboxylic acid group is more preferred. Only one of these acid groups may be used, or two or more thereof may be used. The acid group may be introduced into the binder resin, for example, by using a monomer having an acid group and/or a monomer capable of imparting an acid group after polymerization (hereinafter, sometimes referred to as a "monomer for introducing an acid group"), as a monomer component at the polymerization.

Incidentally, in the case of introducing an acid group by using, as a monomer component, a monomer capable of imparting an acid group after polymerization, a processing for imparting, for example, the later-described acid group is required after polymerization.

Examples of the monomer having an acid group include a carboxyl group-containing monomer such as (meth)acrylic acid and itaconic acid, a phenolic hydroxyl group-containing monomer such as N-hydroxyphenylmaleimide, and an acid anhydride group-containing monomer such as maleic anhydride and itaconic anhydride. Among these, a (meth)acrylic acid is preferred.

Examples of the monomer capable of imparting an acid group after polymerization include a hydroxyl group-containing monomer such as 2-hydroxyethyl(meth)acrylate, an epoxy group-containing monomer such as glycidyl(meth)acrylate, and an isocyanate group-containing monomer such as 2-isocyanatoethyl(meth)acrylate. Only one of these monomers for introducing an acid group may be used, or two or more thereof may be used.

In the case of using a monomer capable of imparting an acid group after polymerization, the processing for imparting an acid group after polymerization includes a processing of modifying a part of a polar group on the polymer side chain through a polymer reaction.

The developable binder resin is preferably a linear organic high-molecular polymer. As the "linear organic high-molecular polymer", a linear organic high-molecular polymer soluble or swellable with an alkaline developer (typically, weakly alkali water) is selected so as to enable alkali development of the film obtained from the photosensitive composition of the present invention.

The linear organic high-molecular polymer includes a polymer having a carboxylic acid group on the side chain, such as methacrylic acid copolymer, acrylic acid copolymer, itaconic acid copolymer, crotonic acid copolymer, maleic acid copolymer and partially esterified maleic acid copolymer described in JP-A-59-44615, JP-B-54-34327, JP-B-58-12577, JP-B-54-25957, JP-A-59-53836 and JP-A-59-71048. An acidic cellulose derivative having a carboxylic acid on the side chain is similarly useful. Also, the liner organic high-molecular polymer includes polymers described in paragraphs [0227] to [0234] of JP-A-2008-292970.

The linear organic high-molecular polymer can be obtained by performing radical polymerization or cationic polymerization of a polymerizable monomer shown below by a conventionally known method.

Examples of the monomer having a carboxyl group include an acrylic acid, a methacrylic acid, an itaconic acid, a crotonic acid, a maleic acid, a fumaric acid, and a 4-carboxyl styrene. Examples of the monomer having an acid anhydride include a maleic anhydride.

As the developable binder resin, an acidic cellulose derivative having a carboxylic acid group on the side chain may be also used. In addition, for example, a resin obtained by adding a cyclic acid anhydride to a polymer having a hydroxyl group is useful.

In the case where the linear organic high-molecular polymer is a copolymer, the monomer which is copolymerized with the monomer having a carboxyl group or the monomer having an acid anhydride includes the following compounds of (1) to (12).

(1) Acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate.

(3) Alkyl methacrylates such as methyl methacrylate, ethyl methacrylate, propyl methacrylate, isopropyl methacrylate, butyl methacrylate, isobutyl methacrylate, n-butyl methacrylate, sec-butyl methacrylate, tert-butyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate.

(4) Acrylamides and methacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, chloromethylstyrene, and p-acetoxystyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-Vinylpyrrolidone, acrylonitrile, and methacrylonitrile.

(11) Unsaturated imides such as maleimide, N-acryloylacrylamide, N-acetylmethacrylamide, N-propionylmethacrylamide, and N-(p-chlorobenzoyl)methacrylamide.

(12) Methacrylic acid-based monomers where a heteroatom is bonded to the α-position, such as compounds described in JP-A-2002-309057 and JP-A-2002-311569.

Among these, alkali-soluble resins having an amide group on the side chain described in JP-A-2001-242612 are suitable because of excellent balance among film strength, sensitivity and developability.

Also, acid group-containing urethane-based binder polymers described in JP-B-7-12004, JP-B-7-120041, JP-B-7-120042, JP-B-8-12424, JP-A-63-287944, JP-A-63-287947, JP-A-1-271741 and JP-A-11-352691, and urethane-based binder polymers having an acid group and a double bond on the side chain described in JP-A-2002-107918 are preferred because of very excellent strength.

Furthermore, acid group-containing acetal-modified polyvinyl alcohol-based binder polymers described in European Patents 993966 and 1204000 and JP-A-2001-318463 are preferred because of excellent balance between film strength and developability.

In addition, polyvinylpyrrolidone, polyethylene oxide and the like are useful as the water-soluble linear organic polymer.

In order to increase the strength of the cured film, for example, an alcohol-soluble nylon and a polyether of 2,2-bis(4-hydroxyphenyl)-propane and epichlorohydrin are also useful.

Among these, a (meth)acrylic resin having an allyl group or a vinyl ester group and a carboxyl group on the side chain, and an alkali-soluble resin having a double bond on the side chain described in JP-A-2000-187322 and JP-A-2002-62698 are, as described later, preferred as the developable binder resin for use in the present invention, because the double bond functions as a polymerizable group.

The binder resin may be any of a random polymer, a block polymer, a graft polymer and the like.

The above-described binder resin can be synthesized by a conventionally known method.

Examples of a solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, ethylene glycol monomethyl ether acetate, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water.

One of these solvents is used alone, or two or more thereof are mixed and used.

Examples of the radical polymerization initiator used in the synthesis of the binder resin include an organic peroxide such as benzoyl peroxide, cumene hydroperoxide, tert-butyl hydroperoxide, diisopropyl peroxycarbonate, di-tert-butyl peroxide and tert-butyl peroxybenzoate, and an azo compound such as 2,2'-azobisisobutyronitrile.

The radical polymerization initiator is used in an amount of preferably from 1 to 20 parts by mass per 100 parts by mass of monomers.

Other useful examples of the alkali-soluble linear organic high-molecular polymer as a precursor of the developable binder resin for use in the present invention include a polymer obtained by adding an acid anhydride to a polymer having a hydroxyl group, a polyhydroxystyrene-based resin, a polysiloxane-based resin, a poly(2-hydroxyethyl(meth)acrylate), polyvinylpyrrolidone, polyethylene oxide, and polyvinyl alcohol. The linear organic high-molecular polymer may be a polymer obtained by copolymerizing a monomer having hydrophilicity. Examples thereof include alkoxyalkyl(meth)acrylate, hydroxyalkyl(meth)acrylate, glycerol(meth)acrylate, (meth)acrylamide, N-methylolacrylamide, secondary or tertiary alkyl acrylamide, dialkylaminoalkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or linear propyl(meth)acrylate, branched or linear butyl(meth)acrylate, and phenoxyhydroxypropyl(meth)acrylate. Other useful examples of the monomer having hydrophilicity include monomers having a tetrahydrofurfuryl group, a phosphoric acid group, a phosphoric acid ester group, a quaternary ammonium salt group, an ethyleneoxy chain, a propyleneoxy chain, a sulfonic acid group or a group derived from its salt, or a morpholinoethyl group.

Among these various alkali-soluble binder resins, in view of heat resistance, a polyhydroxystyrene-based resin, a polysiloxane-based resin, an acrylic resin an acrylamide-based resin and an acryl/acrylamide copolymer resin are preferred; and in view of developability control, an acrylic resin, an acrylamide resin and an acryl/acrylamide copolymer resin are preferred.

Preferred examples of the acrylic resin include a copolymer composed of a monomer selected from benzyl(meth)acrylate, (meth)acrylic acid, hydroxyethyl(meth)acrylate, (meth)acrylamide and the like, and commercially available products KS RESIST-106 (produced by Osaka Organic Chemical Industry Ltd.) and CYCLOMER P Series (produced by Daicel Chemical Industries, Ltd.).

The developable binder resin for use in the present invention may or may not have a polymerizable group but in order to more decrease the solubility of the resin for an alkali developer by the action of an active species, the developable binder resin preferably has a polymerizable group.

The polymerizable group is not particularly limited, but examples thereof include an unsaturated group (e.g., unsaturated double bond), an epoxy group and an oxetane group, with an unsaturated group being preferred.

The polymerizable group may be introduced into the binder resin, for example, by polymerizing the above-described alkali-soluble binder resin from a monomer capable of imparting a polymerizable group after polymerization, and applying a processing for imparting a polymerizable group after the polymerization.

Representative examples of the alkali-soluble binder resin having a polymerizable group include a resin obtained by reacting a carboxyl group-containing resin with a glycidyl group-containing unsaturated compound such as glycidyl (meth)acrylate and allyl glycidyl ether, or with an unsaturated alcohol such as allyl alcohol, 2-hydroxy acrylate and 2-hydroxy methacrylate; a resin obtained by reacting a carboxyl group-containing resin having a hydroxyl group with a free isocyanate group-containing unsaturated compound or an unsaturated acid anhydride; a resin obtained by reacting an addition reaction product of an epoxy resin and an unsaturated carboxylic acid, with a polybasic acid anhydride; a resin obtained by reacting an addition reaction product of a conjugated diene copolymer and an unsaturated dicarboxylic acid anhydride, with a hydroxyl group-containing polymerizable monomer; and a resin in which an unsaturated group is produced by synthesizing a resin having a specific functional group capable of causing an elimination reaction by a base treatment to give an unsaturated group, and applying a base treatment to the resin.

Among these, preferred are, for example, a resin obtained by reacting a carboxyl group-containing resin with a glycidyl group-containing unsaturated compound such as glycidyl (meth)acrylate and allyl glycidyl ether; a resin obtained by polymerizing a hydroxyl group-containing (meth)acrylic acid ester compound and reacting the obtained resin with a free isocyanate group-containing (meth)acrylic acid ester such as 2-isocyanate ethyl(meth)acrylate; a resin having a structural unit represented by formulae (21) to (23) later; and a resin in which an unsaturated group is produced while keeping an alkali-soluble group by synthesizing a resin having a specific functional group capable of causing an elimination reaction by a base treatment to give an unsaturated group and applying a base treatment to the resin.

The alkali-soluble bonder resin having a polymerizable group preferably has at least one structural unit selected from the structural units represented by any of the following formulae (21) to (23).

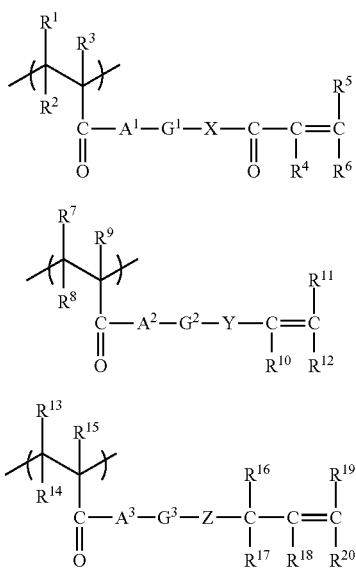

In formulae (21) to (23), each of $A^1$, $A^2$ and $A^3$ independently represents an oxygen atom, a sulfur atom or —N($R^{21}$)—, wherein $R^{21}$ represents an alkyl group which may have a substituent. Each of $G^1$, $G^2$ and $G^3$ independently represents a divalent organic group. Each of X and Z independently represents an oxygen atom, a sulfur atom or —N($R^{22}$)—, wherein $R^{22}$ represents an alkyl group which may have a substituent. Y represents an oxygen atom, a sulfur atom, a phenylene group which have a substituent, or —N($R^{23}$)—, wherein $R^{23}$ represents an alkyl group which may have a substituent. Each of $R^1$ to $R^{20}$ independently represents a hydrogen atom or a monovalent organic group.

In formula (21), each of $R^1$ to $R^3$ independently represents a hydrogen atom or a monovalent substituent. Each of $R^1$ to $R^3$ is, for example, a hydrogen atom or an alkyl group which may have a substituent. Each of $R^1$ and $R^2$ is preferably a hydrogen atom, and $R^3$ is preferably a hydrogen atom or a methyl group.

Each of $R^4$ to $R^6$ independently represents a hydrogen atom or a monovalent organic group. $R^4$ is, for example, a hydrogen atom or an alkyl group which may have a substituent, and is preferably a hydrogen atom, a methyl group or an ethyl group. Each of $R^5$ and $R^6$ is independently, for example, a hydrogen atom, a halogen atom, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, or an arylsulfonyl group which may have a substituent, and, among them, is preferably a hydrogen atom, an alkoxycarbonyl group, an alkyl group which may have a substituent, or an aryl group which may have a substituent. Here, examples of the substituent which may be introduced include a methoxycarbonyl group, an ethoxycarbonyl group, an isopropyloxycarbonyl group, a methyl group, an ethyl group, and a phenyl group.

$A^1$ represents an oxygen atom, a sulfur atom or —N($R^{21}$)—, and X represents an oxygen atom, a sulfur atom or —N($R^{22}$)—. Here, each of $R^{21}$ and $R^{22}$ includes an alkyl group which may have a substituent.

$G^1$ represents a divalent linking group and is preferably an alkylene group which may have a substituent, more preferably, for example, an alkylene group having a carbon number of 1 to 20, which may have a substituent, a cycloalkylene group having a carbon number of 3 to 20, which may have a substituent, or an aromatic group having a carbon number of 6 to 20, which may have a substituent, and in view of performance such as strength and developability, still more preferably a linear or branched alkylene group having a carbon number of 1 to 10, which may have a substituent, a cycloalkylene group having a carbon number of 3 to 10, which may have a sub stituent, or an aromatic group having a carbon number of 6 to 12, which may have a substituent.

As for the substituent on G', out of the groups where a hydrogen atom is bonded to a heteroatom, a group except for a hydroxyl group, for example, an amino group, a thiol group or a group not containing a carboxyl group, is preferred.

In formula (22), each of $R^7$ to $R^9$ independently represents a monovalent organic group, and examples thereof include a hydrogen atom and an alkyl group which may have a substituent. In particular, each of $R^7$ and $R^8$ is preferably a hydrogen atom, and $R^9$ is preferably a hydrogen atom or a methyl group.

Each of $R^{10}$ to $R^{12}$ independently represents a monovalent organic group, and specific examples of the organic group include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, and an arylsulfonyl group which may have a substituent. Among these, a hydrogen atom, an alkoxycarbonyl group, an alkyl group which may have a substituent, and an aryl group which may have a substituent are preferred.

Here, examples of the substituent which can be introduced are the same as those described in formula (21).

Each $A^2$ independently represents an oxygen atom, a sulfur atom or —N($R^{21}$)—, wherein $R^{21}$ is, for example, a hydrogen atom or an alkyl group which may have a substituent.

$G^2$ represents a divalent linking group and is preferably an alkylene group which may have a substituent, more preferably an alkylene group having a carbon number of 1 to 20, which may have a substituent, a cycloalkylene group having a carbon number of 3 to 20, which may have a substituent, or an aromatic group having a carbon number of 6 to 20, which may have a substituent. Among these, in view of performance such as strength and developability, it is still more preferably a linear or branched alkylene group having a carbon number of 1 to 10, which may have a substituent, a cycloalkylene group having a carbon number of 3 to 10, which may have a substituent, or an aromatic group having a carbon number of 6 to 12, which may have a substituent.

As for the substituent on $G^2$, out of the groups where a hydrogen atom is bonded to a heteroatom, a group except for a hydroxyl group, for example, an amino group, a thiol group or a group not containing a carboxyl group, is preferred.

Y represents an oxygen atom, a sulfur atom, —N($R^{23}$)— or a phenylene group which may have a substituent. Here, $R^{23}$ is, for example, a hydrogen atom or an alkyl group which may have a substituent.

In formula (23), each of $R^{13}$ to $R^{15}$ independently represents a monovalent organic group, and examples thereof include a hydrogen atom and an alkyl group which may have a substituent. In particular, each of $R^{13}$ and $R^{14}$ is preferably a hydrogen atom, and $R^{15}$ is preferably a hydrogen atom or a methyl group.

Each of $R^{16}$ to $R^{20}$ independently represents a monovalent organic group. Each of $R^{16}$ to $R^{20}$ is, for example, a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, or an arylsulfonyl group which may have a substituent, preferably a hydrogen atom, an alkoxycarbonyl group, an alkyl group which may have a substituent, or an aryl group which may have a substituent. Examples of the substituent which can be introduced are the same as those described in formula (I).

$A^3$ represents an oxygen atom, a sulfur atom or —N($R^{21}$)—, and Z represents an oxygen atom, a sulfur atom or —N($R^{22}$)—. $R^{21}$ and $R^{22}$ are the same as those in formula (21).

$G^3$ represents a divalent linking group and is preferably an alkylene group which may have a substituent, more preferably an alkylene group having a carbon number of 1 to 20, which may have a substituent, a cycloalkylene group having a carbon number of 3 to 20, which may have a substituent, or an aromatic group having a carbon number of 6 to 20, which may have a substituent. Among them, in view of performance such as strength and developability, it is still more preferably a linear or branched alkylene group having a carbon number of 1 to 10, which may have a substituent, a cycloalkylene group having a carbon number of 3 to 10, which may have a substituent, or an aromatic group having a carbon number of 6 to 12, which may have a substituent.

As for the substituent on $G^3$, out of the groups where a hydrogen atom is bonded to a heteroatom, a group except for a hydroxyl group, for example, an amino group, a thiol group or a group not containing a carboxyl group, is preferred.

A compound containing a structural unit represented by formulae (21) to (23) in a ratio of 20 mol % to less than 95 mol % in one molecule is preferred from the standpoint of enhancing the curability and reducing the development scum. The ratio is more preferably from 25 to 90 mol %, still more preferably from 30% to less than 85 mol %.

The polymer having a structural unit represented by formulae (21) to (23) may be synthesized based on the synthesis methods described in paragraphs [0027] to [0057] of JP-A-2003-262958. Among these methods, the synthesis method 1) in the publication above is preferably used.

For enhancing the crosslinking efficiency, the developable binder resin may have, as a polymerizable group, a cationic polymerizable group on the side chain, and, for example, a polymer containing an epoxy group, an oxetane group or the like on the side chain is also useful.

An epoxy group may be introduced into the alkali-soluble binder resin, for example, by polymerizing an epoxy group-containing monomer (hereinafter, sometimes referred to a "monomer for introducing an epoxy group") as a monomer component. Examples of the monomer having an epoxy group include glycidyl(meth)acrylate, 3,4-epoxycyclohexyl-methyl(meth)acrylate, and an o-(or m- or p-)vinylbenzyl glycidyl ether. Only one of these monomers for introducing an epoxy group may be used, or two or more thereof may be used. In the case where the monomer components used for obtaining the alkali-soluble binder resin contain the monomer for introducing an epoxy group, the content ratio thereof is not particularly limited but is preferably from 5 to 70 mass %, more preferably from 10 to 60 mass %, based on all monomer components.

In the foregoing pages, the binder resin having an alkali-soluble group, which is a preferred embodiment of the developable binder resin for use in the present invention, is described, and when the alkali-soluble group is an acid group, the acid value of the developable binder resin is preferably from 20 to 300 mgKOH/g, more preferably from 40 to 200 mgKOH/g, still more preferably from 50 to 160 mgKOH/g, yet still more preferably from 50 to 100 mgKOH/g. When the acid value is in this range, development scum is more difficult to remain at the pattern formation and higher coating uniformity is obtained.

In the case where the developable binder resin has a polymerizable group and the polymerizable group is an unsaturated group, from the standpoint of enhancing the photosensitivity, the unsaturation value of the developable binder resin is preferably 0.5 mmol/g or more, more preferably 0.7 mmol/g or more, and most preferably 1.0 mmol/g or more. Also, in view of resolution, the unsaturation value is preferably 1.8 mmol/g or less, more preferably 1.5 mmol/g or less.

The "unsaturation value" as used herein means the number of milli-moles of the unsaturated bond per g of the binder resin.

By setting the unsaturation equivalent of the developable binder resin to 0.5 mmol/g or more, that is, by increasing the number of unsaturated double bonds in the resin, the photopolymerizability and sensitivity are enhanced. Furthermore, thanks to the enhancement of polymerizability, the adherence to a solid surface such as support or the immobilization of a hollow or porous particle contained is improved and this is preferred in that a hollow or porous particle in the pattern film is less chipped during development and a pattern having a cross-sectional profile of from tapered to rectangular tends to be readily obtained.

The developable binder resin for use in the present invention may have a cyano group and, specifically, may contain a repeating unit having a cyano group. In this case, the developable binder resin preferably contains a cyano group-containing repeating unit represented by the following formula (III):

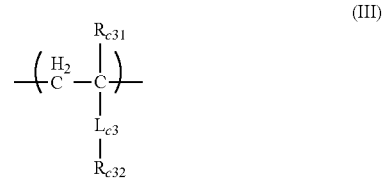

In formula (III), $R_{c31}$ represents a hydrogen atom, an alkyl group, a cyano group, or a —$CH_2$—O-$Rac_2$ group, wherein $Rac_2$ represents a hydrogen atom, an alkyl group or an acyl group.

$R_{c32}$ represents an alkyl group, a cycloalkyl group, an alkenyl group or a cycloalkenyl group. These groups may be substituted with a cyano group.

However, at least one of $R_{c31}$ and $R_{32}$ contains a cyano group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$R_{c32}$ is preferably an unsubstituted alkyl group.

The divalent linking group of $L_{e3}$ is preferably an alkylene group (preferably having a carbon number of 1 to 5), an oxy group or an ester bond (a group represented by —COO—).

The repeating unit represented by formula (III) is preferably repeating unit represented by the following formula (CII)-1:

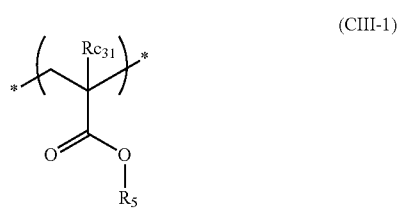

(CIII-1)

In formula (CIII-1), $R_5$ represents a hydrocarbon group. $R_{c31}$ has the same meaning as $R_{c31}$ in formula (III). However, at least one of $R_{c31}$ and $R_5$ has a cyano group.

The hydrocarbon group of $R_5$ includes a chain or cyclic structure. In the case of having a cyclic structure, specific examples of the hydrocarbon group include a monocyclic or polycyclic cycloalkyl group (preferably having a carbon number of 3 to 12, more preferably from 3 to 7), a monocyclic or polycyclic cycloalkenyl group (preferably having a carbon number of 3 to 12, more preferably from 6 to 12), and an aralkyl group (preferably having a carbon number of 7 to 20, more preferably from 7 to 12).

The cycloalkyl group includes a ring assembly hydrocarbon group and a crosslinked cyclic hydrocarbon group. The crosslinked cyclic hydrocarbon ring includes a bicyclic hydrocarbon ring, a tricyclic hydrocarbon ring, a tetracyclic hydrocarbon ring. The crosslinked cyclic hydrocarbon ring also includes a condensed ring formed by fusing, for example, a plurality of 5- to 8-membered cycloalkane rings.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

These cyclic hydrocarbon groups may have a substituent, and preferred substituents include a bromine atom, a chlorine atom, an alkyl group, a hydroxyl group with a hydrogen atom being substituted for, an amino group with a hydrogen atom being substituted for, and a cyano group. Preferred alkyl groups include a methyl group, an ethyl group, a butyl group and a tert-butyl group. This alkyl group may further have a substituent, and the substituent which may be further substituted on includes a bromine atom, a chlorine atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

Specific examples of the cyano group-containing repeating unit represented by formula (III) are illustrated below, but the present invention is not limited thereto (in specific examples, Ra represents a hydrogen atom, an alkyl group, a cyano group or —CH$_2$—O—Rac$_2$, wherein Rac$_2$ represents a hydrogen atom, an alkyl group or an acyl group).

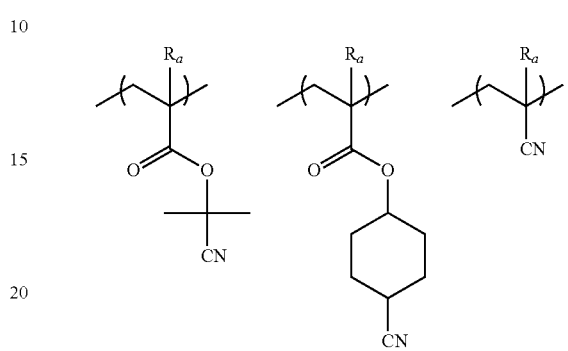

The content of the cyano group-containing repeating unit is preferably from 10 to 80 mol %, more preferably from 10 to 60 mol %, based on all repeating units in the developable binder resin.

The developable binder resin may be also a resin obtained by using a compound represented by the following Formula (E-1) (hereinafter, sometimes referred to as an "ether dimer") as a copolymer.

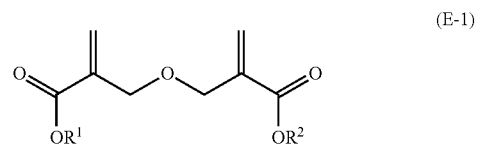

(E-1)

In Formula (E-1), each of $R^1$ and $R^2$ independently represents a hydrogen atom or a hydrocarbon group. The hydrocarbon group as $R^1$ and $R^2$ is preferably a hydrocarbon group having a carbon number of 1 to 15 and may further have a substituent.

When the photosensitive composition of the present invention contains a resin obtained by using a compound represented by formula (E-1) as a copolymer, the heat resistance and transparency of the cured film formed using the composition are more enhanced.

In formula (E-1) showing an ether dimer, the hydrocarbon group represented by R' and $R^2$ is not particularly limited, but examples thereof include a linear or branched alkyl group such as methyl group, ethyl group, n-propyl group, isopropyl group, n-butyl group, isobutyl group, tert-butyl group, tert-amyl group, stearyl group, lauryl group, and 2-ethylhexyl group; an aryl group such as phenyl group; an alicyclic group such as cyclohexyl group, tert-butylcyclohexyl group, dicyclopentadienyl group, tricyclodecanyl group, isobornyl group, adamantyl group, and 2-methyl-2-adamantyl group; an alkoxy-substituted alkyl group such as 1-methoxyethyl group, and 1-ethoxyethyl group; and an aryl group-substituted alkyl group such as benzyl group.

Among these, a group containing primary or secondary carbon being difficult to leave by the action or an acid or heat, such as methyl group, ethyl group, cyclohexyl group and benzyl group is preferred in view of heat resistance.

Incidentally, $R^1$ and $R^2$ may be the same kind of a substituent or may be different substituents.

Specific examples of the ether dimmer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'[oxybis(methylene)]bis-2-propenoate, dibenzyl-2,2'-[oxybis(methylene)]bis-2-propenoate, diphenyl-2,2'-[oxybis(methyl ene)]bis-2-propenoate, dicyclohexyl-2,2'[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. Only one of these ether dimers may be used, or two or more thereof may be used.

The content of the repeating unit corresponding to the compound represented by formula (E-1) is preferably from 20 to 90 mol %, more preferably from 30 to 60 mol %, based on all repeating units in the developable binder resin.

[4-2] Compound Capable of Increasing the Solubility for an Alkali Developer by the Action of an Active Species In view of not only exhibiting developability for an alkali developer in the unexposed area but also diffusing a hollow or porous particle in the film, similarly to the above, the compound capable of increasing the solubility for an alkali developer by the action of an active species is preferably a binder resin (hereinafter, this resin is also sometimes referred to as a "developable binder resin").

That is, as this developable binder resin, all of known resins which are alkali-soluble and capable of increasing the solubility for an alkali developer by the action of an active species can be used.

In the foregoing pages, the developable binder resin as the compound capable of decreasing the solubility for an alkali developer by the action of an active species and the compound capable of increasing the solubility for an alkali developer by the action of an active species is described, and the mass average molecular weight (in terms of polystyrene as measured by the GPC method) of the developable binder resin is preferably from 1,000 to $2 \times 10^5$, more preferably from 2,000 to $1 \times 10^5$, still more preferably from 5,000 to $5 \times 10^4$.

The content of the developable binder resin is preferably from 5 to 50 mass %, more preferably from 10 to 40 mass %, still more preferably from 15 to 30 mass %, based on the entire solid content of the photosensitive composition of the present invention.

The refractive index of the developable binder resin is preferably 1.55 or less, more preferably 1.50 or less, and most preferably 1.48 or less. Within this range, the refractive index of the obtained pattern can be unfailingly reduced.

Specific examples of the developable binder resin include the following binder resins (C-1) to (C-9), but the present invention is not limited thereto. The numerical value shown in each unit indicates the molar fraction of each unit in the resin molecule.

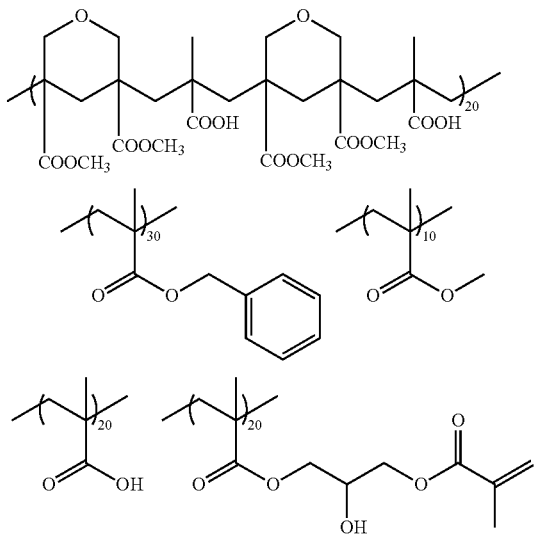

(C-1)

Mw 20,000
Acid value: 42 mgKOH/g,
Unsaturation value: 0.74 mmol/g

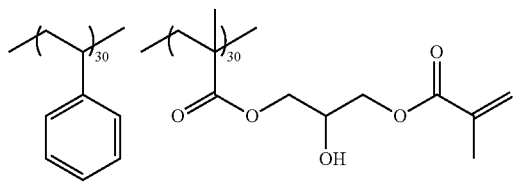

(C-2)

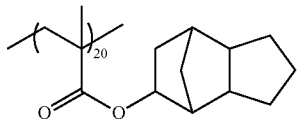

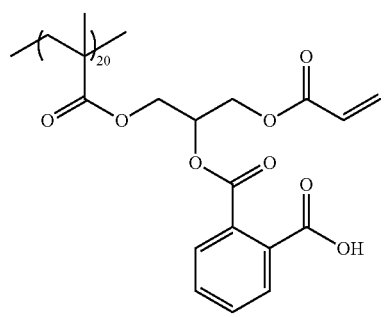

Mw 23,000
Acid value: 45 mgKOH/g,
Unsaturation value: 2.02 mmol/g

-continued

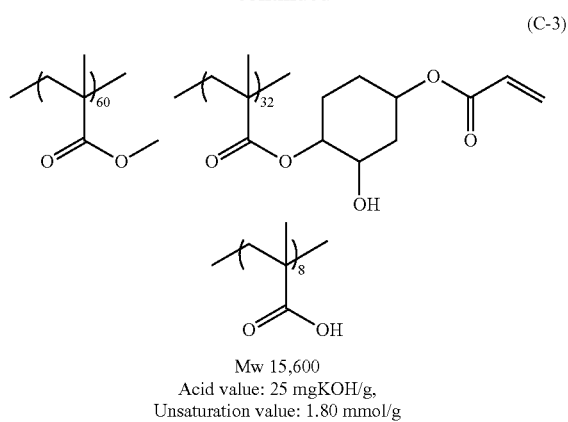

(C-3)

Mw 15,600
Acid value: 25 mgKOH/g,
Unsaturation value: 1.80 mmol/g

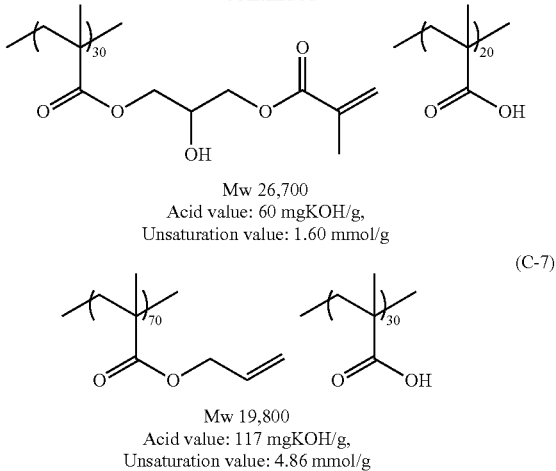

(C-7)

Mw 26,700
Acid value: 60 mgKOH/g,
Unsaturation value: 1.60 mmol/g

Mw 19,800
Acid value: 117 mgKOH/g,
Unsaturation value: 4.86 mmol/g

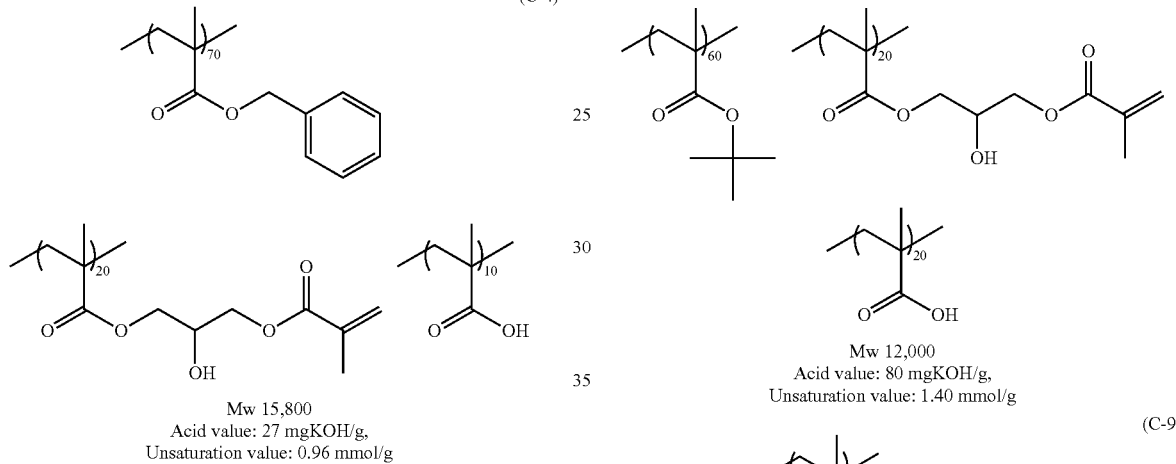

(C-4)

Mw 15,800
Acid value: 27 mgKOH/g,
Unsaturation value: 0.96 mmol/g (C-8)

Mw 12,000
Acid value: 80 mgKOH/g,
Unsaturation value: 1.40 mmol/g

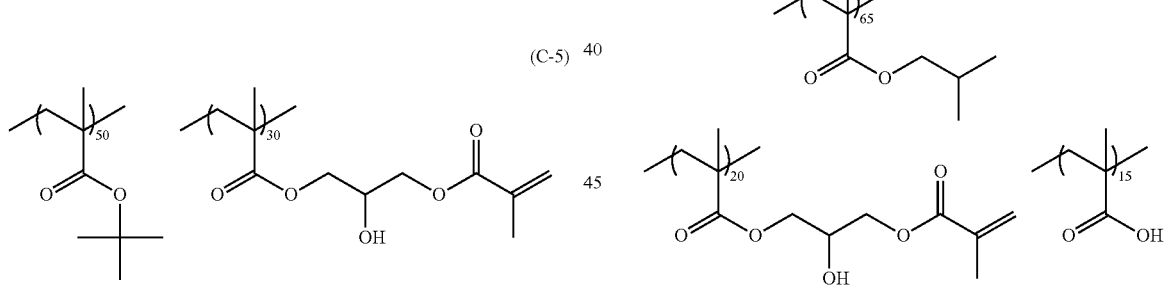

(C-5)

(C-9)

Mw 8,000
Acid value: 60 mgKOH/g,
Unsaturation value: 1.30 mmol/g

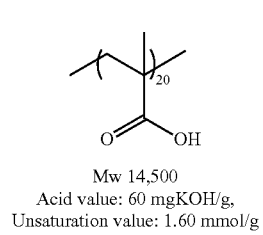

Mw 14,500
Acid value: 60 mgKOH/g,
Unsaturation value: 1.60 mmol/g

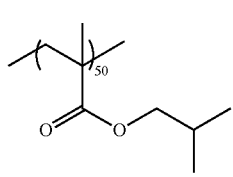

(C-6)

[5] (D) Polymerizable Compound

The photosensitive composition of the present invention may further contain a polymerizable compound (the developable binder resin having a polymerizable group is not included in this polymerizable compound (D)). The polymerizable compound is mainly contained when designing a negative photosensitive composition. In particular, when the compound (C) does not have a polymerizable group, the photosensitive composition preferably further contains (D) a polymerizable compound.

The photopolymerizable compound is described below.

The polymerizable compound is specifically selected from compounds having at least one terminal ethylenically unsaturated bond, preferably two or more terminal ethylenically unsaturated bonds. Such compounds are widely known in this industrial field, and these compounds can be used in the present invention without any particular limitation.

The compound may be in any of chemical forms such as a monomer, a prepolymer (that is, dimer, trimer or oligomer) and a mixture thereof or a (co)polymer thereof. As for the polymerizable compound used in the present invention, one compound may be used alone, or two or more compounds may be used in combination.

Examples of the monomer and a (co)polymer thereof include an unsaturated carboxylic acid (such as acrylic acid, methacrylic acid, itaconic acid, crotonic acid, isocrotonic acid and maleic acid), its esters and amides, and a (co)polymer thereof. Among these, preferred are esters of an unsaturated carboxylic acid and an aliphatic polyhydric alcohol compound, amides of an unsaturated carboxylic acid and an aliphatic polyvalent amine compound, and (co)polymers thereof. Other preferred examples include an addition reaction product of unsaturated carboxylic acid esters or amides having a nucleophilic substituent such as hydroxyl group, amino group and mercapto group, with monofunctional or polyfunctional isocyanates or epoxies, and a dehydration condensation reaction product with a monofunctional or polyfunctional carboxylic acid. An addition reaction product of unsaturated carboxylic acid esters or amides having an electrophilic substituent such as isocyanate group and epoxy group, with monofunctional or polyfunctional alcohols, amines or thiols, and a substitution reaction product of unsaturated carboxylic acid esters or amides having a leaving substituent such as halogen group or tosyloxy group, with monofunctional or polyfunctional alcohols, amines or thiols, are also preferred. As another example, compounds where the above-described unsaturated carboxylic acid is replaced by an unsaturated phosphonic acid, a styrene, a vinyl ether or the like, may be also used.

As for these specific compounds, compounds described in paragraphs 0095 to 0108 of JP-A-2009-288705 may be suitably used also in the present invention.

An ethylenically unsaturated group-containing compound having at least one addition-polymerizable ethylene group and having a boiling point of 100° C. or more under atmospheric pressure is also preferred as the polymerizable compound. Examples thereof include monofunctional acrylates or methacrylates such as polyethylene glycol mono(meth)acrylate, polypropylene glycol mono(meth)acrylate and phenoxyethyl(meth)acrylate; polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl)isocyanurate, compound obtained by adding ethylene oxide or propylene oxide to a polyfunctional alcohol (e.g., glycerin, trimethylolethane) and (meth)acrylating the adduct, urethane acrylates described in JP-B-48-41708, JP-B-50-6034 and JP-A-51-37193, polyester acrylates described in JP-A-48-64183, JP-B-49-43191 and JP-B-52-30490, and epoxy acrylates as a reaction product of epoxy resin and (meth)acrylic acid; and a mixture thereof.

As the compound having at least one addition-polymerizable ethylenically unsaturated group and having a boiling point of 100° C. or more under atmospheric pressure, compounds described in paragraphs [0254] to [0257] of JP-A-2008-292970 are also preferred.

In addition, radical polymerizable monomers represented by the following formulae (MO-1) to (MO-5) may be suitably used. In the formulae, when T is an oxyalkylene group, R is bonded to the terminal on the carbon atom side.

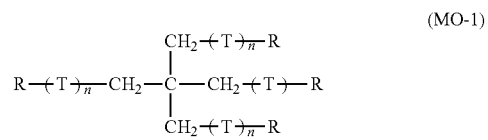

(MO-1)

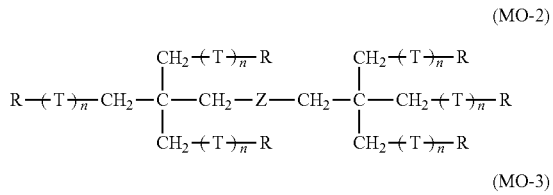

(MO-2)

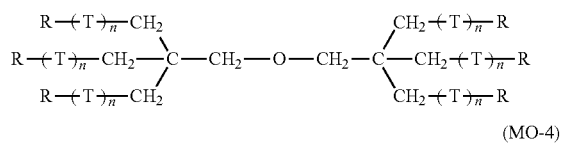

(MO-3)

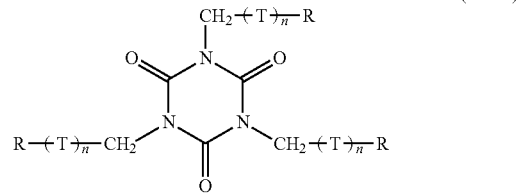

(MO-4)

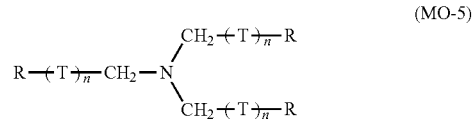

(MO-5)

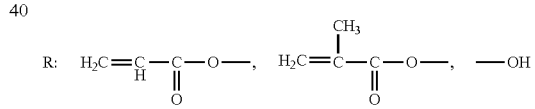

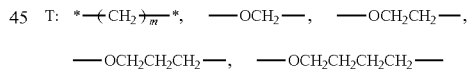

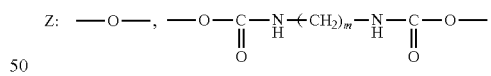

In the formulae, n is 0 to 14 and m is 1 to 8. The plurality of R's or T's present in one molecule may be the same as or different from each other.

In each of radical polymerizable monomers represented by formulae (MO-1) to (MO-5), at least one of the plurality of R's represents a group represented by —OC(=O)CH=CH$_2$ or —OC(=O)C(CH$_3$)=CH$_2$.

As for specific examples of the radical polymerizable monomers represented by formulae (MO-1) to (MO-5), compounds described in paragraphs 0248 to 0251 of JPA-2007-269779 may be suitably used also in the present invention.

Specific examples of the polymerizable compound are illustrated below, but the present invention is not limited thereto.

D-1
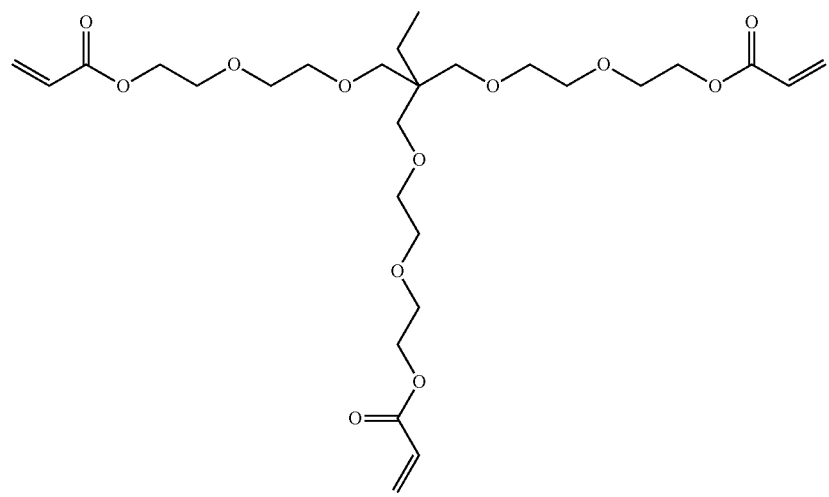
D-2
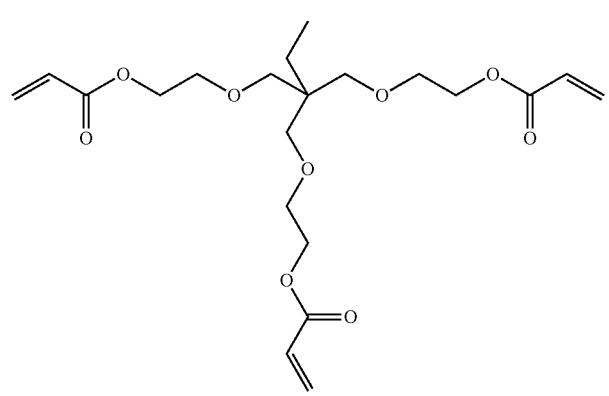
D-3
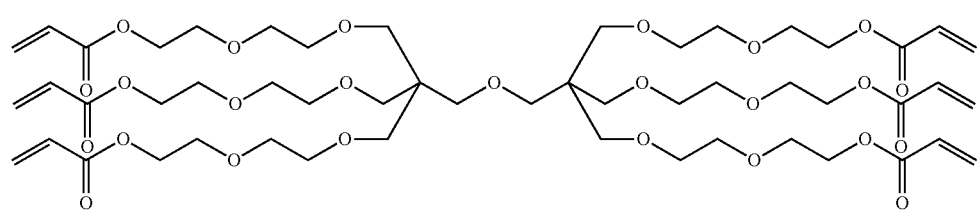
D-4
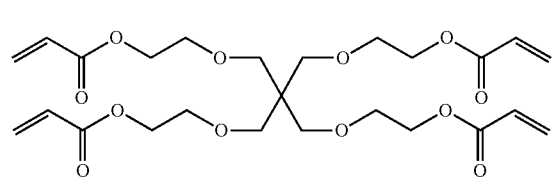
D-5
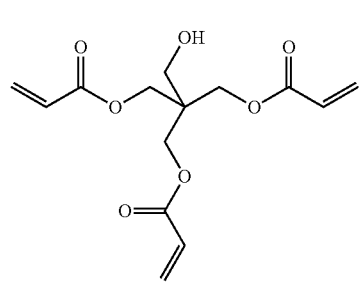
D-6
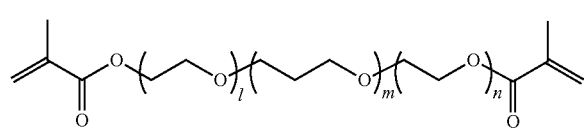
D-7
(l + n ≈ 6, m ≈ 12)

D-8

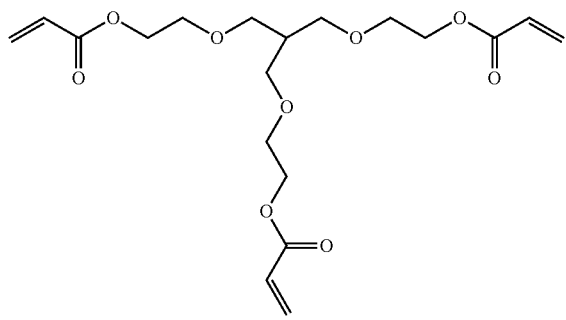

D-9

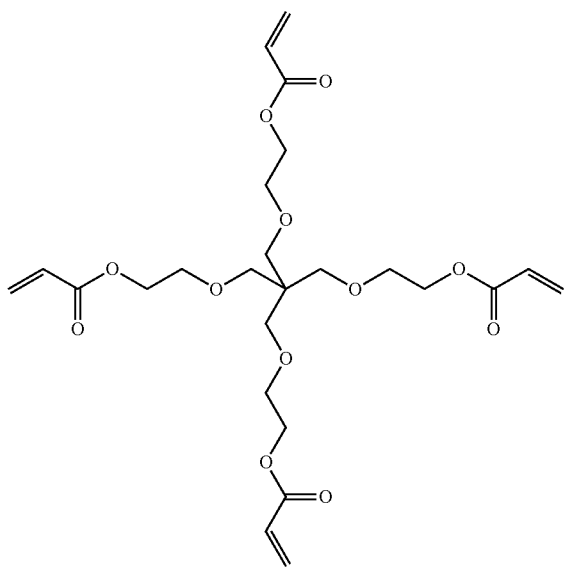

The photosensitive composition of the present invention may or may not contain a polymerizable compound, but in the case of containing a polymerizable compound, the content thereof is preferably from 0.1 to 90 mass %, more preferably from 1.0 to 80 mass %, still more preferably from 2.0 to 70 mass %, based on the entire solid content in the photosensitive composition.

[6] (E) Organic Solvent

The photosensitive resin composition of the present invention generally contains an organic solvent. Basically, the organic solvent is not particularly limited as long as the solubility of each component and the coatability of the photosensitive composition are satisfied, but the organic solvent is preferably selected by taking into consideration, for example, the solubility of ultraviolet absorber and binder, the coatability and the safety.

Preferred examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate)), 3-oxypropionic acid alkyl esters (e.g., methyl 3-oxypropionate, ethyl 3-oxypropionate (e.g., methyl 3-methoxypropionate, ethyl 3-methoxypropionate, methyl 3-ethoxypropionate, ethyl 3-ethoxypropionate)), 2-oxypropionic acid alkyl esters (e.g., methyl 2-oxypropionate, ethyl 2-oxypropionate, propyl 2-oxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate, ethyl 2-oxy-2-methylpropionate (e.g., methyl 2-methoxy-2-methylpropionate, ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether (PGME, another name: 1-methoxy-2-propanol), dipropylene glycol monomethyl ether, propylene glycol monoethyl ether, ethylene glycol monomethyl ether acetate (another name: 2-methoxyethyl acetate), ethylene glycol monoethyl ether acetate (another name: 2-ethoxyethyl acetate), propylene glycol monomethyl ether acetate (PGMEA, another name: 1-methoxy-2-acetoxypropane), propylene glycol monoethyl ether acetate, and propylene glycol monopropyl ether acetate; ketones such as methyl ethyl ketone, cyclohexanone, 2-heptanone and 3-heptanone; and aromatic hydrocarbons such as toluene, xylene and ethylbenzene.

From the standpoint of, for example, improving the solubility of the ultraviolet absorber (described later in detail) and alkali-soluble resin and the coated surface, it is also preferred to mix two or more of these organic solvents. In this case, a mixed solvent composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, methyl ethyl ketone, ethylbenzene, propylene glycol monomethyl ether and propylene glycol monomethyl ether acetate, is more preferred.

In view of coatability, the content of the organic solvent in the photosensitive composition is preferably an amount to give a composition having an entire solid content concentration of 5 to 80 mass %, more preferably from 5 to 60 mass %, still more preferably from 10 to 50 mass %.

[7] Additives

In the photosensitive composition of the present invention, additives such as surfactant, adherence accelerator, polymerization inhibitor, ultraviolet absorber, antioxidant, aggregation inhibitor and sensitizer may be added within the range not impairing the characteristics (e.g., heat resistance, mechanical strength, coatability, adherence) of the film obtained using the composition.

<Surfactant>

From the standpoint of more enhancing the coatability, various surfactants may be added to the photosensitive composition of the present invention. As the surfactant, various surfactants such as fluorine-containing surfactant, nonionic surfactant, cationic surfactant, anionic surfactant and silicone-containing surfactant may be used.

In particular, when the photosensitive composition of the present invention contains a fluorine-containing surfactant, the liquid characteristics (especially, fluidity) of a coating solution prepared is more enhanced, so that the coating thickness uniformity or the liquid saving can be more improved.

That is, in the case of forming a film by using a coating solution to which a photosensitive composition containing a fluorine-containing surfactant is applied, the interface tension between the coating surface and the coating solution is reduced, whereby wettability to the coating surface is improved and the coatability on the coating surface is enhanced. This is effective in that even when a thin film of about several vim is formed with a small liquid volume, a film having a uniform thickness with little thickness unevenness can be more suitably performed.

The content of fluorine in the fluorine-containing surfactant is preferably from 3 to 40 mass %, more preferably from 5 to 30 mass %, still more preferably from 7 to 25 mass %. The fluorine-containing surfactant having a fluorine content in the range above is effective in view of coating film uniformity of the coated film and liquid saving and also has good solubility in the photosensitive composition.

Examples of the fluorine-containing surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, Megaface F781 (all produced by DIC Corp.), Florad FC430, Florad FC431, Florad FC171 (all produced by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon S393, and Surflon KH-40 (all produced by Asahi Glass Co., Ltd.).

Specific examples of the nonionic surfactant include glycerol, trimethylolpropane, trimethylolethane, their ethoxylates and propoxylates (e.g. glycerol propoxylate, glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (such as Pluronic L10, L31, L61, L62, 10R5, 17R2, 25R2, Tetronic 304, 701, 704, 901, 904 and 150R1, all produced by BASF).

Specific examples of the cationic surfactant include a phthalocyanine derivative (EFKA-745, trade name, produced by Morishita Sangyo K.K.), organosiloxane polymer KP341 (produced by Shin-Etsu Chemical Co., Ltd.), (meth)acrylic (co)polymer Polyflow No. 75, No. 90, No. 95 (produced by Kyoeisha Chemical Co., Ltd.), and WO01 (produced by Yusho Co., Ltd.).

Specific examples of the anionic surfactant include WO04, WO05, WO17 (all produced by Yusho Co., Ltd.), and Solsperse 21000 (produced by The Lubrizol Corp.).

Examples of the silicone-containing surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", "Toray Silicone SH8400" (all produced by Dow Corning Toray Silicone Co., Ltd.), "TSF-4440", "TSF-4300", "TSF-4445", "TSF-4460", "TSF-4452" (all produced by Momentive Performance Materials), "KP341", "KF6001", "KF6002" (all produced by Shin-Etsu Silicone Co., Ltd.), "BYK307", "BYK323", and BYK330 (produced by Byk Chemie).

Only one surfactant may be used, or two or more kinds of surfactants may be combined.

The photosensitive composition may or may not contain a surfactant but in the case of containing a surfactant, the content thereof is preferably from 0.001 to 1 mass %, more preferably from 0.01 to 0.1 mass %, based on the entire solid content by mass of the photosensitive composition of the present invention.

<Adherence Accelerator>

The photosensitive composition of the present invention may contain any adherence accelerator within the range not impairing the object of the present invention. Examples of the adherence accelerator include 3-glycidyloxypropyltrimethoxysilane, 1-methacryloxypropylmethyldimethoxysilane, 3-aminoglycidyloxypropyltriethoxysilane, 3-glycidyloxypropylmethyldimethoxysilane, and 3-aminopropyltrimethoxysilane. In addition, compounds described in paragraph [0048] of JP-A-2008-243945 may be used.

The photosensitive composition of the present invention may or may not contain an adherence accelerator but in the case of containing an adherence accelerator, the content thereof is preferably 10 mass % or less, more preferably from 0.005 to 5 mass %, based on the entire solid content in the composition.

<Polymerization Inhibitor>

In the photosensitive composition of the present invention, a small amount of a polymerization inhibitor may be added so as to inhibit unnecessary thermal polymerization of a polymerizable compound during production or storage of the photosensitive composition.

Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine cerous salt.

The content of the polymerization inhibitor is preferably from 0.0005 to 5 mass % based on the entire solid content of the photosensitive composition.

<Ultraviolet Absorber>

The photosensitive composition of the present invention may contain an ultraviolet absorber.

As the ultraviolet absorber, salicylate-based, benzophenone-based, benzotriazole-based, substituted acrylonitrile-based and triazine-based ultraviolet absorbers may be used.

Examples of the salicylate-based ultraviolet absorber include phenyl salicylate, p-tert-butylphenyl salicylate, and p-tert-butylphenyl salicylate. Examples of the benzophenone-based ultraviolet absorber include 2,2'-dihydroxy-4-methoxybenzophenone, 2,2'-dihydroxy-4,4'-dimethoxybenzophenone, 2,2',4,4'-tetrahydroxybenzophenone, 2-hydroxy-4-methoxybenzophenone, 2,4-dihydroxybenzophenone, and 2-hydroxy-4-octoxybenzophenone. Examples of the benzotriazole-based ultraviolet absorber include 2-(2'-hydroxy-3',5'-di-tert-buylphenol)-5-chlorobenzotriazole, 2-(2'-hydroxy-3'-tert-butyl-5'-methylphenyl)-5-chlorobenzotriazole, 2-(2'-hydroxy-3'-tert-amyl-5'-isobutylphenyl)-5-chlorobenzotriazole, 2-(2'-hydroxy-3'-isobutyl-5'-methylphenyl)-5-chlorobenzotriazole, 2-(2'-hydroxy-3'-isobutyl-5'-propylphenyl)-5-chlorobenzotriazole, 2-(2'-hydroxy-3',5'-di-tert-butylphenyl)benzotriazole, 2-(2'-hydroxy-5'-methylphenyl)benzotriazole, and 2-[2'-hydroxy-5'-(1,1,3,3-tetramethyl)phenyl]benzotriazole.

Examples of the substituted acrylonitrile-based ultraviolet absorber include ethyl 2-cyano-3,3-diphenylacrylate and 2-ethylhexyl 2-cyano-3,3-diphenylmethacrylate. Examples of the triazine-based ultraviolet absorber include a mono(hydroxyphenyl)triazine compound such as 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, 2-(2,4-dihydroxyphenyl)-4,6-bis(2,4-dimethylphenyl)-1,3,5-triazine; a bis(hydroxyphenyl)triazine compound such as 2,4-bis(2-hydroxy-4-propyloxyphenyl)-6-(2,4-dimethylphenyl)-1,3,5-triazine, 2,4-bis(2-hydroxy-3-methyl-4-propyloxyphenyl)-6-(4-methylphenyl)-1,3,5-triazine, and 2,4-bis(2-hydroxy-3-methyl-4-hexyloxyphenyl)-6-(2,4-dimethylphenyl)-1,3,5-triazine; and a tris(hydroxyphenyl)triazine compound such as 2,4-bis(2-hydroxy-4-butoxyphenyl)-6-(2,4-dibutoxyphenyl)-1,3,5-triazine, 2,4,6-tris(2-hydroxy-4-octyloxyphenyl)-1,3,5-triazine, and 2,4,6-tris[2-hydroxy-4-(3-butoxy-2-hydroxypropyloxy)phenyl]-1,3,5-triazine.

In the present invention, one of these various ultraviolet absorbers may be used alone, or two or more thereof may be used in combination.

The photosensitive composition may or may not contain an ultraviolet absorber but in the case of containing an ultraviolet absorber, the content thereof is preferably from 0.001 to 1 mass %, more preferably from 0.01 to 0.1 mass %, based on the entire solid content by mass of the photosensitive composition of the present invention.

In the foregoing pages, respective components of the photosensitive composition of the present invention are described, and the photosensitive composition may be a solution obtained by dissolving the components in the above-described organic solvent or may be a sold material not containing an organic solvent.

The photosensitive composition of the present invention may be used for various applications typified by a low refractive index material, and the content of each component or the kind of the additive added is determined according to the purpose.

The photosensitive composition is preferably used for forming various films, more preferably for forming a low refractive index film.

In the photosensitive composition, the content of metals as impurities is preferably sufficiently small. The metal concentration in the composition can be measured with high sensitivity by ICP-MS or the like. In this case, the content of metals other than transition metals is preferably 300 ppm or less, more preferably 100 ppm or less.

The production method of the photosensitive composition is not particularly limited and in the case of containing an organic solvent, respective components of the composition are added to an organic solvent and stirred, whereby the photosensitive composition is obtained.

The composition above is preferably used for film formation after removing insoluble matters, gelled components and the like by filtration through a filter. The pore size of the filter used is preferably from 0.05 to 2.0 µm, more preferably from 0.05 to 1.0 µm, and most preferably from 0.05 to 0.5 µm. The material of the filter is preferably polytetrafluoroethylene, polyethylene, polypropylene or nylon, more preferably polytetrafluoroethylene, polyethylene or nylon.

[8] Pattern Forming Method

The pattern forming method of the present invention comprises a step of forming a photosensitive film, a step of exposing the photosensitive film, and a development step of developing the exposed photosensitive film with an alkali developer to obtain a pattern film.

Here, the photosensitive film is formed from the photosensitive composition of the present invention.

The present invention also relates to a pattern film obtained by the pattern forming method above.

The formation method of the photosensitive film formed from the photosensitive composition of the present invention is not particularly limited, but the photosensitive composition is coated on a substrate by an arbitrary method such as spin coating method, roller coating method, dip coating method, scanning method, spraying method, bar coating method and inkjet method, the solvent is removed by a heat treatment, if desired, to form a coating film (photosensitive film), and a prebaking treatment is applied thereto, whereby the photosensitive film can be formed.

Examples of the substrate include a silicon wafer substrate, an $SiO_2$ wafer substrate, an SiN wafer substrate, a glass substrate, a substrate obtained by forming a layer of various metals on a surface of the substrate above, and a substrate coated with a plastic film, a microlens or an on-chip color filter for image sensor.

The method for coating the composition on the substrate is preferably a spin coating, a scan coating or an inkjet method, more preferably a spin coating method. With respect to the spin coating, a commercially available apparatus can be used. Examples of the apparatus which can be preferably used include CLEAN TRACK Series (manufactured by Tokyo Electron Ltd.), D-Spin Series manufactured by Dainippon Screen Mfg. Co., Ltd.), SS Series and CS Series (manufactured by Tokyo Ohka Kogyo Co., Ltd.).

As for the condition of spin coating, any rotation speed may be employed, but in view of in-plane uniformity of the film, the rotation speed is preferably about 1,300 rpm for a silicon substrate with a diameter of 300 mm. The method for discharging the composition solution may be either dynamic discharge of discharging the composition solution onto a rotating substrate or static discharge of discharging the composition solution onto a stationary substrate, but in view of in-plane uniformity of the film, dynamic discharge is preferred. From the standpoint of suppressing the amount of the composition consumed, a method of preliminarily discharging only the main solvent of the composition onto the substrate to form a liquid film and then discharging the composition thereover may be also employed. The spin coating time is not particularly limited but in view of throughput, is preferably within 180 seconds. Also, from the standpoint of conveyance of the substrate, it is also preferred to apply a treatment (edge rinse, back rinse) for allowing no remaining of the film on the substrate edge part.

The photosensitive composition of the present invention can be easily removed using a known washing solution even when the composition is attached, for example, to a nozzle at the discharge port of the coating apparatus, to a piping part of the coating apparatus, or to the interior of the coating apparatus. In this case, for more efficiently performing removal by washing, the solvent described above as the solvent contained in the photosensitive composition of the present invention is preferably used as the washing solution.

Washing solutions described, for example, in JP-A-7-128867, JP-A-7-146562, JP-A-8-278637, JP-A-2000-273370, JP-A-2006-85140, JP-A-2006-291191, JP-A-2007-2101, JP-A-2007-2102 and JP-A-2007-281523 may be also suitably used as the washing solution for removal by washing of the photosensitive composition of the present invention.

As for the washing solution, an alkylene glycol monoalkyl ether carboxylate or an alkylene glycol monoalkyl ether is preferably used.

One of these solvents usable as the washing solution may be used alone, or two or more thereof may be mixed and used.

In the case of mixing two or more solvents, a mixed solvent obtained by mixing a solvent having a hydroxyl group and a solvent not having a hydroxyl group is preferred. The mass ratio of the solvent having a hydroxyl group to the solvent not having a hydroxyl group is from 1/99 to 99/1, preferably from 10/90 to 90/10, more preferably from 20/80 to 80/20. In particular, the mixed solvent is preferably a mixed solvent of propylene glycol monomethyl ether acetate (PGMEA) and propylene glycol monomethyl ether (PGME) in a ratio of 60/40.

Incidentally, for enhancing permeability of the washing solution to the photosensitive composition, a surfactant described above as the surfactant which can be contained in the photosensitive composition may be added to the washing solution.

The method for prebaking treatment is not particularly limited, but a generally employed method such as heating on a hot plate, heating using a furnace, and heating by irradiation of light from a xenon lamp in RTP (Rapid Thermal Processor) or the like, may be applied. Heating on a hot plate and heating using a furnace are preferred. As the hot plate, a commercially available apparatus can be preferably used and, for example, CLEAN TRACK Series (manufactured by Tokyo Electron Ltd.), D-Spin Series (manufactured by Dainippon Screen Mfg. Co., Ltd.) and SS Series or CS Series (manufactured by Tokyo Ohka Kogyo Co., Ltd.) may be preferably used. As the furnace, Cx Series (manufactured by Tokyo Electron Co., Ltd.) may be preferably used. The conditions of prebaking include conditions that a hot plate or an oven is used and heating is performed at 60 to 150° C. (preferably from 60 to 120° C.) for 0.5 to 15 minutes.

The step of exposing the photosensitive film is performed through a mask, if desired.

Examples of the actinic ray or radiation which can be applied to the exposure include infrared light, g-line, h-line, i-line, KrF light, ArF light, X-ray and electron beam. In view of exposure dose, sensitivity and resolution, i-line, KrF light, ArF light and electron beam are preferred and furthermore, in view of general versatility, i-line and KrF light are most preferred. In the case of using i-line for the irradiation light, the light is preferably irradiated with an exposure dose of 100 to 10,000 mJ/cm$^2$. In the case of using KrF light, the light is preferably irradiated with an exposure dose of 30 to 300 mJ/cm$^2$.

Also, the exposed composition layer may be, if desired, heated at 70 to 180° C. for 0.5 to 15 minutes by using a hot plate or an oven before the subsequent development processing.

Subsequently, the composition layer after exposure is developed (development step) with a developer to develop the exposed area of the photosensitive film and obtain a pattern film (development step), whereby a negative or positive pattern (resist pattern) can be formed.

Examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, cyclic amines such as pyrrole and piperidine, 1,8-diazabicyclo[5,4,0]undec-7-ene, or 1,5-diazabicyclo[4,3,0]-5-nonene.

This alkaline aqueous solution may be used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 0.3 mass % tetramethylammonium hydroxide is preferred.

As the developing method, for example, a method of dipping the substrate in a bath filled with the developer for a fixed time (dipping method), a method of raising the developer on the substrate surface by a surface tension and keeping it still for a fixed time, thereby performing the development (puddle method), a method of spraying the developer on the substrate surface (spraying method), and a method of continuously ejecting the developer on the substrate rotating at a constant speed while scanning the developer ejecting nozzle at a constant rate (dynamic dispense method) may be applied. The development time varies depending on the photosensitive composition but is usually on the order of 30 to 120 seconds at 25° C.

In the case where the above-described various developing methods include a step of ejecting the developer toward the photosensitive film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the photosensitive film or pattern film is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

A step of rinsing the film with a rinsing solution is preferably provided after the development.

As for the rinsing solution in the rinsing treatment, pure water is used, and the pure water may be used after adding an appropriate amount of a surfactant thereto.

In the rinsing step, the wafer after development is subjected to a washing treatment using a rinsing solution. The method for washing treatment is not particularly limited but, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method) may be applied. Above all, it is preferred to perform the washing treatment by the spin coating method and after the washing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step may be performed by heating the pattern film in a heating apparatus such as hot plate and oven.

In the post-baking, the heating temperature is usually from 120 to 250° C., preferably from 160 to 230° C. The heating time varies depending on the heating means, but the heating time is usually from 5 to 30 minutes in the case of heating on a hot plate and is usually from 30 to 90 minutes in the case of heating in an oven.

With respect to the post-baking, a step baking method or the like where the heating is performed two or more times may be also employed.

After the development step, if desired, curing of the pattern film may be further accelerated by applying post-heating and/or post-exposure to the pattern film formed (post-curing step by a film curing treatment).

Thanks to this treatment, the light fastness, weather resistance and film strength are increased and furthermore, the low refractive index property may be sometimes enhanced.

The film curing treatment means to further cure the pattern film on the substrate and impart solvent resistance or the like to the film. The film curing method is preferably a heating treatment (firing). For example, a polymerization reaction of the polymerizable group remaining in the resin, which proceeds during post-heating, may be utilized. The conditions of the post-heating treatment are preferably from 100 to 600° C., more preferably from 200 to 500° C., still more preferably from 200 to 450° C., and preferably from 1 minute to 3 hours, more preferably from 1 minute to 2 hours, still more preferably from 1 minute to 1 hour. The post-heating treatment may be performed in several parts.

In the present invention, the film curing may be effected, instead of a heat treatment, by irradiating a high-energy ray, such as light irradiation and radiation irradiation, thereby causing a polymerization reaction between the polymerizable groups still remaining in the polymer. Examples of the high-energy ray include an electron beam, an ultraviolet ray and an X-ray, but the present invention is not limited to these methods.

In the case of using an electron beam as the high-energy ray, the energy is preferably from 0.1 to 50 keV, more preferably from 0.2 to 30 keV, still more preferably from 0.5 to 20 keV. The total dose of electron beams is preferably from 0.01 to 5 $\mu C/cm^2$, more preferably from 0.01 to 2 $\mu C/cm^2$, still more preferably from 0.01 to 1 $\mu C/cm^2$. The substrate temperature at the irradiation with an electron beam is preferably from 0 to 500° C., more preferably from 20 to 450° C., still more preferably from 20 to 400° C. The pressure is preferably from 0 to 133 kPa, more preferably from 0 to 60 kPa, still more preferably from 0 to 20 kPa.

From the standpoint of preventing oxidation of the polymer, the atmosphere in the periphery of the substrate is preferably an inert atmosphere such as Ar, He and nitrogen. Also, a gas such as oxygen, hydrocarbon and ammonia may be added for the purpose of reaction with a plasma, an electromagnetic wave or a chemical species generated due to interaction with the electron beam. The electron beam irradiation may be performed a plurality of times. In this case, the conditions of the electron beam irradiation need not be the same every time, and the irradiation may be performed under different conditions every time.

An ultraviolet ray may be also used as the high-energy ray. In using an ultraviolet ray, the irradiation wavelength region is preferably from 160 to 400 nm, and the output thereof directly above the substrate is preferably from 0.1 to 2,000 $mWcm^{-2}$. At the ultraviolet irradiation, the substrate temperature is preferably from 250 to 450° C., more preferably from 250 to 400° C., still more preferably from 250 to 350° C. From the standpoint of preventing oxidation of the polymerization product of the present invention, the atmosphere in the periphery of the substrate is preferably an inert atmosphere such as Ar, He and nitrogen. In this case, the pressure is preferably from 0 to 133 kPa.

The film may be also cured by performing the heat treatment and the high-energy ray irradiation at the same time or in succession.

The pattern forming method of the present invention may further include, after the development step, a step of etching the pattern film (hereinafter, sometimes referred to as an "etching step").

The etching conditions in the etching step are not particularly limited and may be variously set according to the purpose. In the description of the present invention, the "etching step" includes not only a step performed for the purpose of removing the pattern film but also a step performed for the purpose of modifying the pattern film.

In the present invention, the etching step above is preferably an etching step performed for the purpose of modifying the pattern film. Here, the etching step performed for the purpose of modifying the pattern film is, unlike the etching step performed under severe etching conditions for the purpose of removing the pattern film, a step performed under weaker etching conditions for the purpose of modifying the pattern film without greatly impairing the mechanical strength of the pattern film (for example, without greatly changing the profile of the pattern film).

Usually, a solid-state imaging element chip is obtained by dicing (cutting) a wafer having arrayed thereof a large number of solid-state imaging elements, and the dicing is performed while cooling the system and washing out cutting debris by using a liquid such as pure water. In the case where the pattern film is a film (for example, a low refractive index film covering a microlens) constituting an optical device of a solid-state imaging device, cutting debris remains attached to the surface of the film and may cause a problem that in a solid-state imaging element device, the function of the film is impaired. If the film surface has high hydrophobicity, the cutting debris attached can be hardly removed with pure water supplied during dicing, and to solve this problem, the above-described etching step performed for the purpose of modifying the pattern film so as to make the film surface more hydrophilic is sometimes applied. However, even when an etching step performed for the purpose of modifying the pattern film (that is, an etching step under relatively weak conditions) is applied, if the dry etching resistance of the pattern is low, there arises a problem that a mechanical strength loss is liable to occur (for example, surface roughness of the pattern film is increased).

In the pattern forming method of the present invention, the above-described pattern film of the present invention is used, so that modification of the pattern film can be unfailingly performed without impairing the mechanical strength of the pattern film. Also, in the present invention, the modification of the pattern film enables not only modification of hydrophilicity or hydrophobicity on the surface of the pattern film but also reduction of the refractive index of the pattern film. That is, according to the pattern forming method of the present invention, an etching step is performed after the development step, whereby a pattern film more reduced in the refractive index can be easily obtained.

Examples of the apparatus used in such an etching step include a plasma etching apparatus, a reactive ion etching apparatus and a reactive ion beam etching apparatus, but the step is preferably performed using a parallel plate RIE (reactive ion etching) apparatus.

The etching step is usually performed using a process gas. The process gas is suitably oxygen (for example, from 10 to 400 ml/min). The RF power is suitably, for example, from 1.0 to 7.0 W/cm$^2$, and the pressure is suitably, for example, from 1 to 10 Pa. The etching time is preferably from 5 to 60 seconds. As the gas, argon and oxygen may be used in combination.

In a preferred configuration of the pattern film of the present invention, the hollow or porous particle(A) is a low refractive index component, and the organic component derived from the compound (B) or compound (C) works out to a high refractive index component having a high refractive index compared with the particle (A). In such a configuration, the reduction in the refractive index of the pattern film by the above-described etching step is considered to be brought about because the organic component decomposes in the etching step and the amount of the high refractive index component can be reduced.

Here, if the etching resistance of the pattern film is low, that is, if the film etching rate is high, the mechanical strength of the pattern film is readily impaired and the etching step for more reducing the refractive index of the pattern film cannot be adequately performed.

However, the pattern film of the present invention is, as described above, excellent in the dry etching resistance. More specifically, the pattern film of the present invention contains (A) a hollow or porous particle and therefore, the film etching rate is low. In turn, compared with the pattern film not containing (A) a hollow or porous particle, in the pattern film of the present invention, the etching step can be adequately performed, so that a pattern film greatly reduced in the refractive index while keeping the mechanical strength can be obtained.

As for the film thickness, a coating film can be formed to a thickness, in terms of dry thickness, of approximately from 0.05 to 1.5 μm by one coating and to a thickness of approximately from 0.1 to 3 μm by two coatings.

The photosensitive composition of the present invention is not particularly limited in its usage but, as described above, is preferably used for producing a low refractive index film.

Accordingly, the present invention also relates to a low refractive index film which is a pattern film obtained by the pattern forming method of the present invention.

The present invention also relates to an optical device having the low refractive index film above.

The present invention also relates to a solid-state imaging device comprising such an optical device.

The low refractive index film (for example, an antireflection film) is described in detail below. The following preferred ranges of various physical properties of the low refractive index film are ranges preferred particularly in the usage as a low refractive index film, but the usage is not limited thereto.

<Low Refractive Index Film>

The pattern film obtained using the above-described composition exhibits an excellent low refractive index property. More specifically, the refractive index (wavelength: 633 nm, measurement temperature: 25° C.) of the pattern film is preferably 1.35 or less, more preferably from 1.23 to 1.34, still more preferably from 1.25 to 1.33. Within this range, the pattern film is useful as the later-described antireflection film.

<Antireflection Film>

The suitable use embodiment of the pattern film obtained using the composition of the present invention includes an antireflection film. In particular, the pattern film is suitable as an antireflection film for an optical device (for example, a microlens for image sensor, a plasma display panel, a liquid crystal display or an organic electroluminescence).

In use as an antireflection film, the reflectance is preferably as low as possible. Specifically, the average specular reflectance in a wavelength range of 450 to 650 nm is preferably 3% or less, more preferably 2% or less, and most preferably 1% or less. Incidentally, the reflectance is preferably smaller and most preferably 0.

The haze of the antireflection film is preferably 3% or less, more preferably 1% or less, and most preferably 0.5% or less. Incidentally, the haze is preferably smaller and most preferably 0.

In the case of using the above-described film as a single-layer antireflection film, assuming that the refractive index of the transparent substrate is nG, the refractive index n of the antireflection film is preferably $\sqrt{nG}$, that is, a square root of the reflective index of the transparent substrate. For example, the refractive index of an optical glass is from 1.47 to 1.92 (wavelength: 633 nm, measurement temperature: 25° C.) and therefore, n of the single-layer antireflection film formed on the optical glass is preferably from 1.21 to 1.38. At this time, the thickness of the antireflection film is preferably from 10 nm to 10 μm.

In the case of using the pattern film for a multilayer antireflection film, the pattern film may be used as a low-refractive index layer and the antireflection film may contain, for example, under the film, a high refractive index layer, a hardcoat layer and a transparent substrate. At this time, a high refractive index layer may be directly formed on the substrate without forming a hardcoat layer. Also, a medium refractive index layer may be further provided between the high refractive index layer and the low refractive index layer or between the high refractive index layer and the hardcoat layer.

Respective layers of the multilayer antireflection film are described in detail below.

(1) Low Refractive Index Layer

The low refractive index layer is composed of a pattern film obtained, as described above, using the composition of the present invention. The refractive index and thickness of the low refractive index layer are described below.

(i) Refractive Index

The refractive index (wavelength: 633 nm, measurement temperature: 25° C.) of the pattern film obtained using the composition of the present invention, that is, the refractive index of the low refractive index film (sometimes referred to as a low refractive index layer), is preferably 1.35 or less, because when a low reflective index film having a refractive index of 1.35 or less is combined with a high refractive index film (sometimes referred to as a high refractive index layer), the antireflection effect can be unfailingly brought out.

The refractive index of the low refractive index film is more preferably 1.34 or less, still more preferably 1.33 or less. In the case of providing the low refractive index film in a plurality of layers, it is sufficient if the refractive index of at least one layer takes a value in the range above.

Also, in the case of providing a low refractive index layer, the refractive index difference from the high refractive index layer is preferably set to 0.05 or more because a higher antireflection effect is obtained. When the refractive index difference between the low refractive index layer and the high refractive index layer is 0.05 or more, a synergistic effect of these antireflection film layers is readily obtained and in turn, an antireflection effect is more unfailingly obtained. The refractive index difference between the low refractive index layer and the high refractive index layer is more preferably from 0.1 to 0.8, still more preferably from 0.15 to 0.7.

(ii) Thickness

The thickness of the low refractive index layer is also not particularly limited but is preferably, for example, from 20 to 300 nm. When the thickness of the low refractive index layer is 20 nm or more, an adhesive force to the underlying high refractive index film is unfailingly obtained, and when the thickness is 300 nm, interference of light scarcely occurs and an antireflection effect is more unfailingly obtained. The thickness of the low refractive index layer is more preferably from 20 to 250 nm, still more preferably from 20 to 200 nm. Incidentally, in order to obtain higher antireflection performance, when the low reflective index layer is provided in a plurality of layers to configure a multilayer structure, the total thickness thereof may be set to be from 20 to 300 nm.

(2) High Refractive Index Layer

The curable composition for forming the high refractive index layer is not particularly limited but preferably contains, as a film-forming component, one resin alone or two or more resins in combination, such as epoxy-based resin, phenolic resin, melamine-based resin, alkyd-based resin, cyanate-based resin, acrylic resin, polyester-based resin, urethane-based resin and siloxane resin. Such a resin can form a strong thin film as the high refractive index layer, as a result, the scratching resistance of the antireflection film can be remarkably improved.

However, the refractive index of such a resin alone is usually from 1.45 to 1.62 and is sometimes insufficient to obtain high antireflection performance. Therefore, the refractive index is preferably adjusted to 1.70 to 2.20 by blending an inorganic particle having a high refractive index, such as metal oxide particle. As for the curing mode, a curable composition capable of being heat-cured, ultraviolet-cured or electron beam-cured may be used, but an ultraviolet-curable composition having good productivity is preferably used.

The thickness of the high refractive index layer is not particularly limited but is preferably, for example, from 20 to 30,000 nm. When the thickness of the high refractive index layer is 20 nm or more, in the case of being combined with the low refractive index layer, an antireflection effect or an adhesive force to the substrate is more unfailingly obtained, and when the thickness is 30,000 nm or less, interference of light scarcely occurs and an antireflection effect is more unfailingly obtained. The thickness of the high refractive index layer is more preferably from 20 to 1,000 nm, still more preferably from 50 to 500 nm. Also, in order to obtain higher antireflection performance, in the case of providing the high refractive index layer in a plurality of layers to configure a multilayer structure, the total thickness thereof may be set to be from 20 to 30,000 nm. Incidentally, in the case of providing a hardcoat layer between the high refractive index layer and the substrate, the thickness of the high refractive index layer can be from 20 to 300 nm.

(3) Hard Coat Layer

The constituent material of the hardcoat layer used for the antireflection film of the present invention is not particularly limited. Such a material includes one resin alone or two or more resins in combination, such as siloxane resin, acrylic resin, melamine resin and epoxy resin.

The thickness of the hardcoat layer is also not particularly limited but is preferably from 1 to 50 μm, more preferably from 5 to 10 μm. When the thickness of the hardcoat layer is 1 μm or more, the adhesive force of the antireflection film to the substrate is more unfailingly enhanced, and when the thickness is 50 μm or less, uniform formation of the layer is facilitated.

(4) Substrate

The substrate used for the antireflection film of the present invention is not particularly limited in its kind but includes, for example, a transparent substrate composed of glass, a polycarbonate-based resin, a polyester-based resin, an acrylic resin or a triacetyl cellulose (TAC) resin, and a silicon wafer. By forming an antireflection film having such a substrate, an excellent antireflection effect can be obtained in a wide utilization field of the antireflection film, such as camera lens part, screen display part of TV (CRT), and color filter or imaging element in a liquid crystal display.

The pattern film obtained using the composition of the present inventive can be also used as a surface protective film or a retardation film for optical devices (for example, microlens).

The composition of the present invention may be suitably used particularly for coating of a microlens (here, the concept of the microlens includes the concept of the microlens array).

The pattern film obtained by the pattern forming method of the present invention is formed using the photosensitive composition of the present invention and is formed to enjoy a low refractive index, small development scum and high resolution and therefore, this film is very useful as a film provided particularly in a region requiring suppressed light reflection, for example, of various OA devices, liquid crystal display devices such as liquid crystal television, cellular phone and projector, imaging optical systems for on-chip color filter of facsimile, electronic copier, solid-state imaging device and the like, and optical fiber connectors.

In particular, when the pattern film of the present invention is formed on a microlens by using the pattern forming method of the present invention, a high-precision microlens whose surface is covered with a film having the above-described characteristics can be easily and simply formed with high product yield.

EXAMPLES

The present invention is described in greater detail below by referring to Examples, but the present invention is not limited to these Examples.

<Preparation of Resist Composition>

The components shown in Table 1 below were dissolved in the solvent shown in Table 1, and the solution was filtered through a polytetrafluoroethylene-made filter having a pore size of 0.2 μm to prepare the photosensitive compositions of Examples 1 to 13 and Comparative Examples 1 and 2.

In Table 1, symbols in the compound (B), the compound (C) (excluding (C-10)) and the compound (D) correspond to those of specific examples of respective components.

Also, as the compound (B), IRGACURE-OXE01, IRGACURE-OXE02 and IRGACURE-907 produced by BASF Japan were used.

For the hollow or porous particle, the following commercial products were used.

Snowtex PGM-ST:

A 20 mass % dispersion liquid of porous silica produced by Nissan Chemical Industries, Ltd.

SiliNax SP-PN(b):

A hollow silica powder produced by Nittetsu Mining Co., Ltd.

Sluria 2320:

A 20 mass % dispersion liquid of hollow silica produced by JGC C&C.

Sluria 1110:
  A 20 mass % dispersion liquid of hollow silica produced by JGC C&C.
PL-2L-PGME:
  A 20 mass % dispersion liquid of porous silica produced by Fuso Chemical Co., Ltd.
AERODISP G1220:
  A 20 mass % dispersion liquid of porous silica produced by EVONIK.
OSCAL:
  A 20 mass % dispersion liquid of hollow silica produced by Fuso Chemical Co., Ltd.
Snowtex MIBK-SD-L:
  A 30 mass % dispersion liquid of porous silica produced by Nissan Chemical Industries, Ltd.
AERODISP 1030:
  A 20 mass % dispersion liquid of porous silica produced by EVONIK.

For the particle dispersant, the following commercial products were used.
EMULSOGEN COL-020:
  Alkyl ether carboxylic acid produced by Clariant Japan Co., Ltd.
Disperbyk-101:
  Polyamidoamine phosphate produced by BYK Chemie.
PELEX SS-L:
  Sodium alkyldiphenyletherdisulfonate produced by Kao Corp.

In Comparative Examples 1 and 2, Compound (C-10) does not come under the compound (C) capable of changing in the solubility for an alkali developer by the action of an active species but is a resin composed of the following repeating unit.

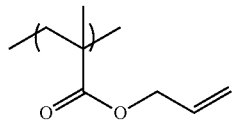

(C-10)

Mw = 30,000

<Production of Low Refractive Index Pattern Film>

The photosensitive composition obtained above was coated on a silicon wafer by a spin coating method and then heated on a hot plate at 100° C. for 2 minutes to obtain a photosensitive film having a thickness of 0.3 μm.

The obtained photosensitive film was exposed through a mask having a dot array pattern differing in the size in the range from 0.5 micron square to 100 micron square, at a wavelength of 365 nm by using an i-line stepper FPA-3000i5+ (manufactured by Canon).

The photosensitive film after the exposure was subjected to puddle development at 23° C. for 60 seconds by using an aqueous solution of 0.3 mass % tetramethylammonium

TABLE 1

| | Hollow or Porous Particle (A) (parts by mass) | Compound (B) Capable of Generating Active Species Upon Irradiation with Actinic Ray or Radiation (parts by mass) | Compound (C) Capable of Changing in Solubility for Alkali Developer (parts by mass) | Polymerizable Compound (D) (parts by mass) | Particle Dispersant (A') (parts by mass) | Organic Solvent (F) (parts by mass) |
|---|---|---|---|---|---|---|
| Example 1 | Snowtex PGM-ST (40) | B-1 (0.1) | C-1 (1.5) | | | cyclohexanone (58.4) |
| Example 2 | SiliNax SP-PN(b) (3.5) | B-2 (0.1) | C-2 (1.4) | | EMULSOGEN COL-020 (0.35) | propylene glycol monomethyl ether acetate (94.65) |
| Example 3 | Sluria 2320 (17.5) | B-3 (0.25) | C-6 (1.25) | | | ethyl lactate/propylene glycol monomethyl ether acetate (41/40) |
| Example 4 | PL-2L-PGME (75) | B-4 (0.3) | C-3 (0.7) | D-1 (0.7) | | propylene glycol monomethyl ether (23.3) |
| Example 5 | AERODISP G1220 (42.5) | B-5 (0.1) | C-4 (1.4) | D-2 (1.4) | | propylene glycol monoethyl ether/ethylbenzene (30/24.6) |
| Example 6 | OSCAL (26.25) | B-6 (0.5) | C-5 (1) | D-3 (0.4) | | ethylbenzene (71.85) |
| Example 7 | Snowtex MIBK-SD-L (8) | B-7 (0.3) | C-6 (1) | D-4 (1) | | ethyl-3-ethoxypropionate (89.7) |
| Example 8 | Sluria 2110 (42.5) | B-8 (0.25) | C-7 (1) | D-5 (0.4) | Disperbyk-101 (0.85) | methyl ethyl ketone/cyclohexanone (50/5) |
| Example 9 | PL-2L-PGME (25) | B-9 (0.3) | C-5 (1) | D-6 (0.7) | Pelex SS-L (1.5) | butyl acetate/methyl-3-methoxypropionate (41.5/30) |
| Example 10 | OSCAL (26.25) | B-9 (0.1) | C-1 (1.5) | D-7 (1.4) | Pelex SS-L (0.26) | 2-ethoxyethyl acetate (70.49) |
| Example 11 | Sluria 2320 (20) | IRGACURE-OXE01 (0.1) | C-8 (1) | | | dipropylene glycol monomethyl ether (78.9) |
| Example 12 | PL-2L-PGME (45) | IRGACURE-OXE02 (1) | C-9 (0.9) | | | diethylene glycol monobutyl ether (53.1) |
| Example 13 | Snowtex PGM-ST (45) | IRGACURE-907 (1) | C-2 (0.9) | | | ethyl lactate (53.1) |
| Comparative Example 1 | AERODISP 1030 (30) | B-1 (0.3) | C-10 (1.4) | D-8 (3.3) | | cyclohexanone (65) |
| Comparative Example 2 | — | B-1 (5) | C-10 (1.4) | D-9 (3) | | butyl acetate (90.6) | hydroxide, then rinsed with water by spin shower and further washed with pure water to obtain a transparent pattern having a film thickness of 0.3 μm.

<Evaluation of Resolution and Scum>

The obtained transparent pattern was observed from above the silicon wafer at a magnification of 30,000 by using a Critical Dimension SEM (S-7800H, manufactured by Hitachi, Ltd.). The minimum size of the obtained dot pattern is shown as the resolution in Table 2. As the numerical value of this minimum size is smaller, the resolution is higher.

Also, in Table 2, the sample was rated B when scum was observed in the periphery of the pattern, and rated A when scum was not observed.

<Dry Etching Resistance>

A first-stage dry etching treatment for 90 seconds was applied to the dot pattern having the minimum size by using a dry etching apparatus (U-621, manufactured by Hitachi High-Technologies Corp.) (RF power: 800 W, antenna bias: 400 W, wafer bias: 200 W, inner pressure of chamber: 4.0 Pa, substrate temperature: 50° C., gas species and flow rate of mixed gas: $CF_4$: 80 mL/min, $O_2$: 40 mL/min and Ar: 800 mL/min). The sample was rated B when surface roughness by the dry etching treatment for 90 seconds was large, and rated A when the surface roughness was small.

<Measurement of Refractive Index of Low Refractive Index Pattern Film>

The photosensitive resin composition obtained above was coated on a silicon wafer and then heated on a hot plate at 100° C. for 2 minutes to obtain a transparent film. This transparent film was measured using an ellipsometer (VASE) manufactured J.A. Woollam Japan Corp. and the value measured at a wavelength of 633 nm and 25° C. was taken as the refractive index.

The results obtained are shown in Table 2.

TABLE 2

|  | Refractive Index | Resolution | Scum | Dry Etching Resistance |
|---|---|---|---|---|
| Example 1 | 1.3 | 30 μm | A | A |
| Example 2 | 1.28 | 50 μm | A | A |
| Example 3 | 1.27 | 70 μm | A | A |
| Example 4 | 1.29 | 30 μm | A | A |
| Example 5 | 1.32 | 40 μm | A | A |
| Example 6 | 1.26 | 50 μm | A | A |
| Example 7 | 1.33 | 80 μm | A | A |
| Example 8 | 1.25 | 70 μm | A | A |
| Example 9 | 1.32 | 40 μm | A | A |
| Example 10 | 1.26 | 50 μm | A | A |
| Example 11 | 1.28 | 20 μm | A | A |
| Example 12 | 1.29 | 20 μm | A | A |
| Example 13 | 1.30 | 100 μm | A | A |
| Comparative Example 1 | 1.35 | Pattern could not be formed. | not measured | A |
| Comparative Example 2 | 1.53 | Pattern could not be formed. | not measured | B |

As seen from the results in Table 2, when the photosensitive composition of the present invention is used, a pattern with a low refractive index and little development scum can be formed with high resolution. Also, it is seen that by using a hollow or porous particle, good dry etching resistance is obtained.

On the other hand, in Comparative Examples not containing a compound corresponding to the compound (C) of the present invention, the pattern could not be resolved (pattern could not be formed) (in Table 2, the sum in Comparative Examples was not measured, because the pattern could not be formed, as for the dry etching resistance in Comparative Examples, the dry etching resistance of a film having not formed therein a pattern was measured).

The pattern film of Example 3 obtained in <Production of Low Refractive Index Pattern Film> above was subjected to an etching process under the conditions shown in the Table below by using a parallel plate RIE (reactive ion etching) apparatus (U-621, manufactured by Hitachi High-Technologies Corp.) and then measured for the refractive index according to <Measurement of Refractive Index of Low Refractive Index Pattern Film>.

TABLE 3

| | Conditions | Refractive Index |
|---|---|---|
| Example 3 | no etching | 1.27 |
| Example 3-1 | process gas: $O_2$ (300 ml/min) bias 0 W: etching time 10 sec | 1.22 |
| Example 3-2 | process gas: $O_2$ (300 ml/min) bias 400 W: etching time 30 sec | 1.18 |

As seen from Table 3, it could be confirmed that the refractive index can be reduced by applying an etching process to the pattern film. Also, as seen from comparison between Example 3-1 and Example 3-2, when the conditions of the etching process became stronger, the refractive index was more reduced.

The entire disclosure of each and every foreign patent application from which the benefit of foreign priority has been claimed in the present application is incorporated herein by reference, as if fully set forth.

What is claimed is:

1. A photosensitive composition comprising:

(A) a hollow or porous particle, (B) a compound capable of generating an active species upon irradiation with an actinic ray or radiation, and (C) a compound capable of changing its solubility in an alkali developer by the action of the active species, wherein the compound (C) is an alkali-soluble binder resin having a polymerizable group and has at least one structural unit selected from the structural units represented by any of the following formulae (21) to (23); or the compound (C) has a structural unit represented by the following formula (24):

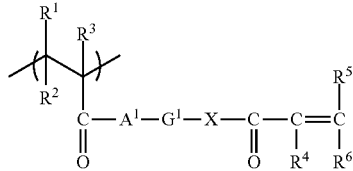

Formula (21)

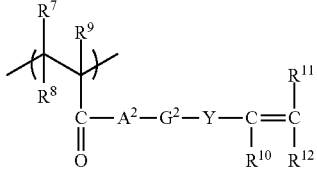

Formula (22)

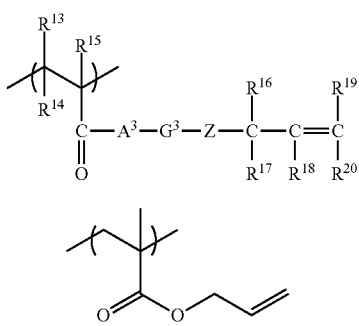

Formula (23)

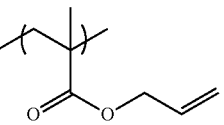

Formula (24)* wherein in formulae (21) to (23), each of $A^1$, $A^2$ and $A^3$ independently represents an oxygen atom, a sulfur atom or $—N(R^{21})—$, wherein $R^{21}$ represents an alkyl group which may have a substituent, each of $G^1$, $G^2$ and $G^3$ independently represents a divalent linking group, each of X and Z independently represents an oxygen atom, a sulfur atom or $—N(R^{22})—$, wherein $R^{22}$ represents an alkyl group which may have a substituent, Y represents an oxygen atom, a sulfur atom, a phenylene group which may have a substituent, or $—N(R^{23})—$, wherein $R^{23}$ represents an alkyl group which may have a substituent, and each of $R^1$ to $R^{20}$ independently represents a hydrogen atom or a monovalent substituent.

2. The photosensitive composition as claimed in claim 1, wherein the refractive index of the hollow or porous particle is from 1.10 to 1.40.

3. The photosensitive composition as claimed in claim 1, wherein the compound (C) is a compound capable of decreasing its solubility in an alkali developer by the action of the active species.

4. The photosensitive composition as claimed in claim 1, wherein the compound (C) is a binder resin having an alkali-soluble group.

5. The photosensitive composition as claimed in claim 4, wherein the binder resin further has a polymerizable group.

6. The photosensitive composition as claimed in claim 1, which further contains (D) a polymerizable compound.

7. The photosensitive composition as claimed in claim 1, which further contains (A') a particle dispersant.

8. The photosensitive composition as claimed in claim 1, which is used for coating of a microlens.

9. A pattern forming material which is the photosensitive composition claimed in claim 1.

10. A photosensitive film formed of the photosensitive composition claimed in claim 1.

11. A pattern forming method comprising a step of forming the photosensitive film claimed in claim 10, a step of exposing said photosensitive film, and a development step of developing the exposed photosensitive film with an alkali developer to obtain a pattern film.

12. The pattern forming method as claimed in claim 11, which further comprises a step of etching the pattern film after the development step.

13. A pattern film obtained by the pattern forming method claimed in claim 11.

14. A low refractive index film which is the pattern film claimed in claim 13.

15. An optical device having the low refractive index film claimed in claim 14.

16. A solid-state imaging device comprising the optical device claimed in claim 15.

17. The photosensitive composition as claimed in claim 1, wherein the refractive index of the hollow particle is from 1.10 to 1.40, and the hollow particle is a hollow silica particle.

* * * * *